United States Patent
Tano et al.

(10) Patent No.: US 7,896,722 B2
(45) Date of Patent: Mar. 1, 2011

(54) DISPLAY DEVICE AND MANUFACTURING METHOD THEREOF

(75) Inventors: Tomoko Tano, Tokyo (JP); Tomoyuki Shirasaki, Higashiyamato (JP)

(73) Assignee: Casio Computer Co., Ltd., Tokyo (JP)

( * ) Notice: Subject to any disclaimer, the term of this patent is extended or adjusted under 35 U.S.C. 154(b) by 260 days.

(21) Appl. No.: 11/641,897

(22) Filed: Dec. 19, 2006

(65) Prior Publication Data

US 2007/0138943 A1 Jun. 21, 2007

(30) Foreign Application Priority Data

Dec. 20, 2005 (JP) .................................. 2005-365681

(51) Int. Cl.
*H01J 9/20* (2006.01)
*H01J 9/22* (2006.01)

(52) U.S. Cl. ................................. 445/24; 445/23; 445/25

(58) Field of Classification Search ................ 445/23–25
See application file for complete search history.

(56) References Cited

U.S. PATENT DOCUMENTS

| | | | |
|---|---|---|---|
| 6,784,459 B2 | 8/2004 | Seki et al. | |
| 2003/0214691 A1* | 11/2003 | Magno et al. | 359/196 |
| 2003/0227253 A1* | 12/2003 | Seo et al. | 313/504 |
| 2005/0100660 A1* | 5/2005 | Ito et al. | 427/66 |
| 2005/0112341 A1* | 5/2005 | Ito et al. | 428/209 |
| 2005/0153114 A1* | 7/2005 | Gupta et al. | 428/201 |
| 2005/0244570 A1* | 11/2005 | Tanase et al. | 427/10 |

FOREIGN PATENT DOCUMENTS

| | | |
|---|---|---|
| CN | 1201637 C | 5/2005 |
| JP | 2001-345179 A | 12/2001 |
| JP | 2003-257656 A | 9/2003 |
| JP | 2003-316291 A | 11/2003 |
| JP | 2004-330136 A | 11/2004 |
| JP | 2004330136 A * | 11/2004 |

OTHER PUBLICATIONS

Chinese Office Action dated Mar. 29, 2010 and English translation thereof in counterpart Chinese Application No. 200910146615.4.

* cited by examiner

*Primary Examiner* — Bumsuk Won
*Assistant Examiner* — Nathaniel J Lee
(74) *Attorney, Agent, or Firm* — Holtz, Holtz, Goodman & Chick, PC

(57) ABSTRACT

A partitioning wall is formed on one surface of a substrate. The partitioning wall has a lattice-like shape and defines a plurality of surrounded-regions. Each of the surrounded-regions is surrounded by the partitioning wall and includes a plurality of pixel-regions on which pixels are to be formed. A first predetermined region of the substrate adjacent to a part of the partitioning wall is maintained at a higher temperature, and a second predetermined region other than the first predetermined region is maintained at a lower temperature. Liquid which contains a carrier transporting material is coated on the pixel-regions in the surrounded-regions while maintaining the temperatures of the substrate.

13 Claims, 12 Drawing Sheets

※ IN DIAGRAM, ENCIRCLED NUMBERS INDICATE LEVELS OF LAYERS, AND LARGER NUMBERS INDICATE LAYERS OF HIGHER LEVELS.

VL

RELATED ART

DISPLAY DEVICE AND MANUFACTURING METHOD THEREOF

BACKGROUND OF THE INVENTION

1. Field of the Invention

The present invention relates to a display device and a manufacturing method thereof, and particularly relates to a display device having a display panel on which arrayed are a plurality of display pixels having a light emitting element such as an organic electroluminescent element or the like, which has a light emitting function layer formed therein with a liquid material comprising a light emitting function material coated, and a manufacturing method of the display device.

2. Description of the Related Art

Recently, as next-generation display devices that follow liquid crystal display devices (LCD) widely used as monitors and displays of personal computers, video equipment, portable information devices, etc., displays (display devices) having a display panel of a light emitting element type, on which self light emitting elements such as organic electroluminescent elements (hereinafter abbreviated as "organic EL element") are arrayed in two dimensions, have been vigorously researched and developed so that they can be practically used and become widespread.

Particularly, a light emitting element type display that is adapted to the active matrix drive system has a higher display response speed and no view angle dependency and can obtain a display image with a higher luminance, a higher contrast, a higher preciseness, etc. as compared with a liquid crystal display device. And such a light emitting element type display is advantageous since it can be formed into a slimmer and lighter body because it requires no backlight unlike a liquid crystal display device.

Here, a basic structure of a known organic EL element will be briefly explained, as an example of a self light emitting element used in a light emitting element type display.

FIG. 10 is a schematic cross sectional diagram showing a basic structure of an organic EL element.

As shown in FIG. 10, the organic EL element roughly has a structure where an anode (positive pole) electrode 112, an organic EL layer (light emitting function layer) 113 made of an organic compound, etc. (organic material), and a cathode (negative pole) electrode 114 are sequentially stacked on one surface side (the upper side in the diagram) of an insulating substrate 111 made of a glass substrate or the like.

The organic EL layer 113 has a stacked structure of, for example, a hole transporting layer (hole injection layer) 113a made of a hole transporting material (hole injection layer forming material) and an electron-transporting light emitting layer (light emitting layer) 113b made of an electron-transporting light emitting material. Various low molecular or high molecular organic materials are known as the hole transporting material or the electron-transporting light emitting material to be used for the organic EL layer 113 (the hole transporting layer 13a and the electron-transporting light emitting layer 113b).

Generally, a low molecular organic material imparts a relatively high light emitting efficiency to the organic EL layer, but requires vapor deposition to be applied in its manufacturing process. Therefore, in selectively forming a thin organic film made of the low molecular material only on the anode electrode as the pixel forming region, it is necessary to use a mask for preventing the low molecular material from being vapor-deposited on the regions other than the anode electrode. And since this cannot avoid the low molecular material being adhered even onto the surface of the mask, there is a problem that the material loss is large in the manufacturing process and it is difficult to obtain pixels with high definition.

On the other hand, though a high molecular organic material gives a lower light emitting efficiency to the organic EL layer than given by a low molecular organic material, it can allow the use of an ink jetting method (liquid drop jetting method) or the like as a wet film forming method. Therefore, only the pixel forming region (the region on the anode electrode) can be selectively coated with the solution of the organic material, making it possible to form a thin film of the organic EL layer (the hole transporting layer and the electron-transporting light emitting layer) efficiently and finely.

In the manufacturing process of an organic EL element having an organic EL layer made of such a high molecular organic material, the organic EL layer 113 is formed roughly through the step of forming an anode electrode (positive electrode) on each region (pixel forming region) on which a display pixel is to be formed on an insulating substrate (panel substrate) made of a glass substrate or the like, forming a partitioning wall (bank) made of an insulating resin material or the like on the boundary between adjoining display pixels to define the region surrounded by the partitioning wall as the pixel forming region, and then, with the use of an ink jetting device, coating a liquid material, which is made of a high-molecular organic hole-transporting material dispersed or dissolved in a solvent, on the region and heating and drying the coated region, thereby to form the hole transporting layer 113a shown in FIG. 10, and sequentially through the step of coating a liquid material made of a high-molecular organic electron-transporting light emitting material dispersed or dissolved in a solvent with subsequent heating and drying to form the electron-transporting light emitting layer 113b shown in FIG. 10.

According to the manufacturing method using the ink jetting manner, etc., the above-described partitioning wall has a function of defining each pixel forming region and preventing the phenomenon of the light emitting colors mixing (color mixing), etc. between the display pixels, due to liquid materials of different colors mixing into adjoining pixel forming regions when the liquid materials made of the high molecular organic material are coated. The structure of an organic EL element (display panel) with such a partitioning wall and a manufacturing method using the ink jetting manner for forming an organic EL layer (a hole transporting layer and an electron-transporting light emitting layer) are specifically explained in, for example, Unexamined Japanese Patent Application KOKAI Publication No. 2003-257656.

The organic EL element having the above-described element structure emits light (excited light) VL based on energy that is produced by the recombination of holes and electrons that are injected into the hole transporting layer 113a or into the electron-transporting light emitting layer 113b when a positive voltage is applied to the anode electrode 112 and a negative voltage is applied to the cathode electrode 114 from a direct-current voltage source 115 as shown in FIG. 10. At this time, the light emitting intensity of the visible light VL is controlled according to the amount of the current that flows across the anode electrode 112 and the cathode electrode 114.

Here, by forming either one of the anode electrode 112 and the cathode electrode 114 by using an electrode material having optical transparency, and forming the other of the two by using an electrode material having a light blocking effect and reflectivity, it is possible to realize an organic EL element having a bottom emission type light emitting structure which emits visible light VL toward the other side (the lower side in the diagram) of the insulating substrate 111 as shown in FIG. 10, or an organic EL element having a top emission type light emitting structure which emits visible light VL toward the one surface side (the upper side in the diagram) of the insulating substrate 111.

However, according to the manufacturing method of an organic EL layer (a hole transporting layer and an electron-transporting light emitting layer) using an ink jetting manner, etc. described above, there might occur a phenomenon that the ends of the liquid surface of the coating liquid LQD are pressed up along the side surfaces of the partitioning wall 121 as shown in FIG. 11, due to the characteristic (water repellency) of the surface of the partitioning wall formed to protrude at the boundary between the display pixels (pixel forming regions) and the surface tension of the liquid material (coating liquid) made of an organic material. As a result, the organic EL layer is formed thinly at the center region of the region (pixel forming region) where the organic material is coated, while the organic EL layer is thicker at the circumferential region, making the overall thickness of the pixel uneven. Note that FIG. 11 is a schematic diagram for explaining the problem of the manufacturing process of the organic EL element.

SUMMARY OF THE INVENTION

Hence, an object of the present invention is to provide a display device having a display panel provided with a light emitting function layer (organic EL layer) whose thickness is uniform almost over the entire region of the pixel forming region of a display pixel, and a manufacturing method for realizing the display device.

A manufacturing method of a display device according to a first aspect of the present invention is a manufacturing method of a display device having a display panel comprising display elements emitting light, and comprises:

a temperature distribution setting step of heating a first predetermined region adjacent to a part of a partitioning wall which is formed on one surface of a substrate and defines a plurality of surrounded-regions each of which is surrounded by the partitioning wall and includes a plurality of pixel-regions on which pixels are to be formed at a first temperature, and heating a second predetermined region other than the first predetermined region at a second temperature lower than the first temperature, each of the first predetermined region and the second predetermined region including at least a part of the pixel-regions; and a containing liquid coating step of coating a containing liquid which contains a carrier transporting material on the pixel-regions.

The first predetermined region may include corners of the surrounded-regions.

The first predetermined region may include parts of the surrounded regions, the parts contacting the partitioning wall at its three aspects.

The second predetermined region may include parts of the surrounded-regions, the parts contacting the partitioning wall at its two opposing aspects.

At the containing liquid coating step, the containing liquid may be coated on the plurality of the pixel-regions with use of an ink jetting method or a nozzle printing method.

The partitioning wall may have at least one part made of a single metal or a metal alloy.

The at least one part of the partitioning wall may form parts of wirings which are directly or indirectly connected to the pixels, each of the pixels including a display element and a driving circuit for driving the display element.

Each of the pixels may have the display element and a light emission drive circuit that has transistors and drives the display element so as to emit light.

The first temperature may be higher than the second temperature by 5 to 20° C.

The plurality of pixels formed on the plurality of pixel-regions which are included in each of the surrounded-regions may emit a light of a same color and may be arranged on a straight line.

The containing liquid may be coated continuously on the plurality of pixel-regions.

The first predetermined region may be maintained at the first temperature by a first heater, and the second predetermined region may be maintained at the second temperature by a second heater.

The first predetermined region may comprise starting end regions or finishing end regions of lines along which the containing liquid that contains the carrier transporting material is coated.

The carrier transporting material may be made of a high-molecular organic material, and the display elements may comprise organic electroluminescent elements.

A display device according to a second aspect of the present invention is a display device which is manufactured according to the manufacturing method of the display device according to the first aspect.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

A display device and a manufacturing method thereof will be specifically explained below by showing an embodiment. In the embodiment shown below, a case will be explained, that an organic EL element having an organic EL layer made of a high molecular organic material is used as a light emitting element that constitutes a part of a display pixel. Since the display panel is driven according to an active matrix drive system, each display pixel is provided with a light emission drive circuit for driving the organic EL element to emit light at a desired luminance gradation. Note that the light emission drive circuit comprises, for example, one or a plurality of function elements such as a transistor, etc., and wiring layers. The temperature that is adopted in a heat treatment applied in the process of forming the transistor is above the allowable temperature limit at which the organic material of the organic EL layer of the organic EL element can maintain its property. Therefore, in this embodiment, the transistor is formed at an earlier step than the organic EL element of each display pixel and formed more closely to an insulating substrate than the organic EL element is.

(Display Panel)

First, a display panel and a display pixel used in the display panel according to the present invention will be explained.

Figure 1:
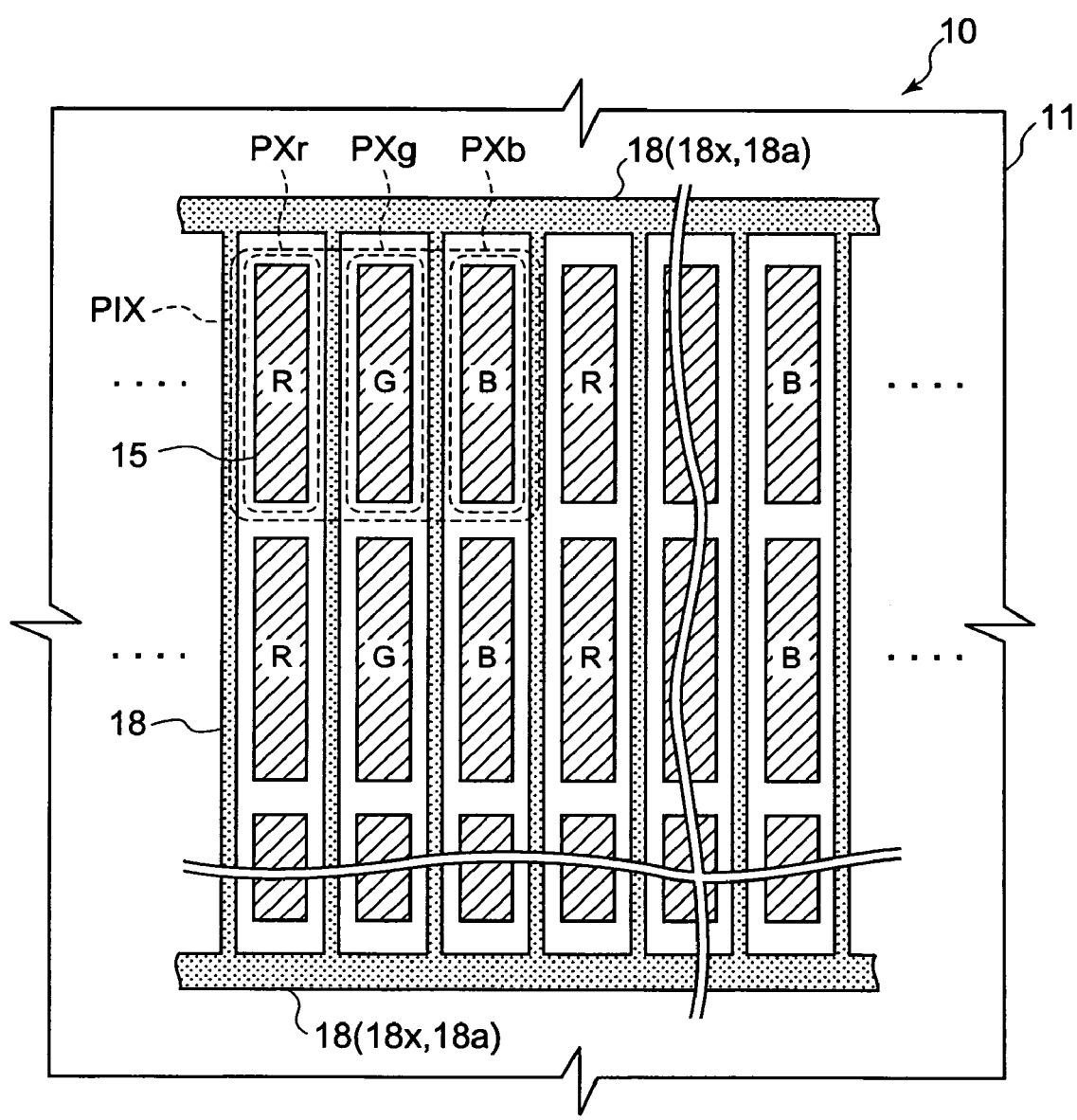
FIG. 1 is a schematic plan view of a principal part showing an example of a pixel array on a display panel used in a display device according to the present invention.
Figure 2:
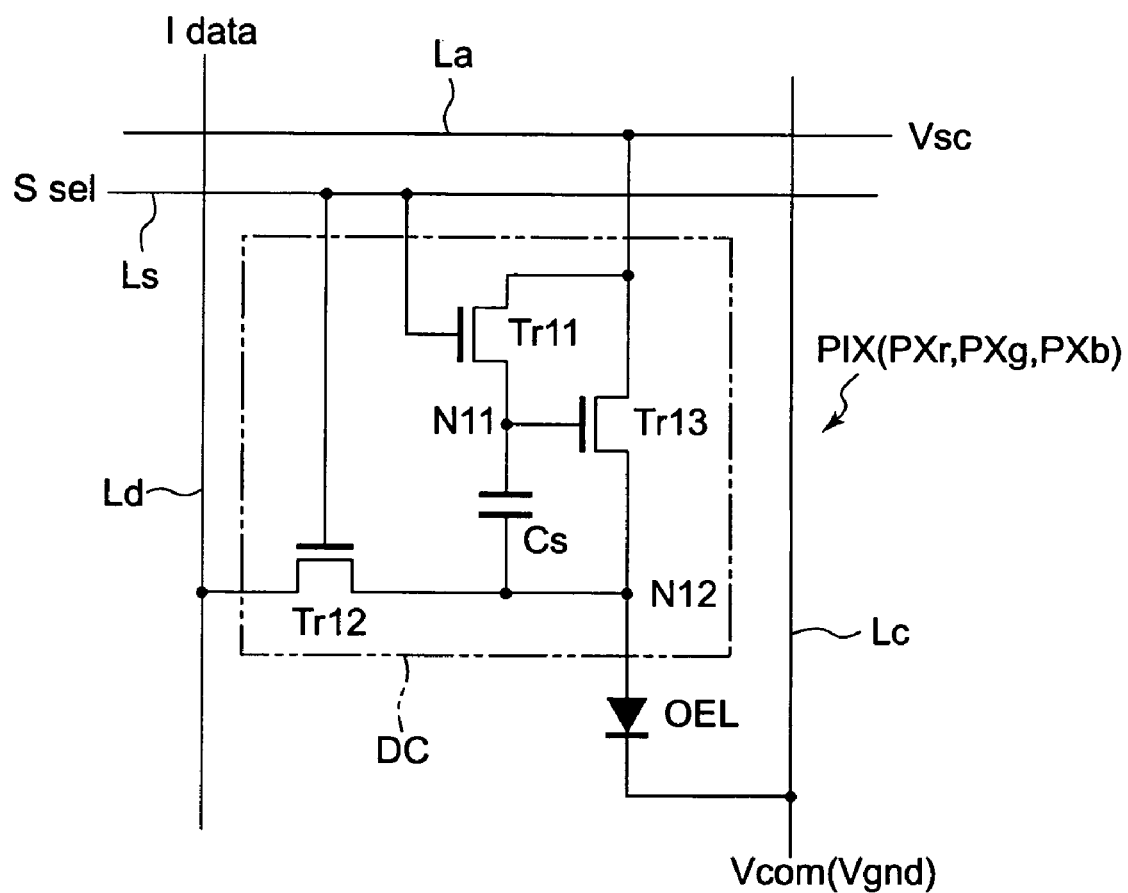
FIG. 2 is an equivalent circuit diagram showing an example of a circuit structure of each display pixel (a light emitting element and a light emission drive circuit) two-dimensionally arrayed on the display panel of the display device according to the present invention.

FIG. 1 is a schematic plan view of a principal part showing an example of a pixel array on the display panel to be used in the display device according to the present invention. FIG. 2 is an equivalent circuit diagram showing an example of a circuit structure of each display pixel (a light emitting element and a light emission drive circuit) arrayed in two dimensions on the display panel of the display device according to the present invention. In the plan view shown in FIG. 1, to facilitate understanding, only the relationship between the arrangement of pixel electrodes provided individually for display pixels (color pixels) and the arrangement of the partitioning wall (referred to as "bank" in the present embodiment) as shown in the above-described prior part, as seen from the observer side of the display panel (insulating substrate), is shown, and illustration of the transistor, etc. in the light emission drive circuit DC shown in FIG. 2 provided for each display pixel for driving the organic EL element (light emitting element) of each display pixel to emit light is omitted. Further, in FIG. 1, hatching is applied to the pixel electrodes and the bank for the purpose of clearly indicating their arrangement.

As shown in FIG. 1, the display device (display panel) according to the present invention has color pixels PXr, PXg, and PXb having three colors of red (R), green (G), and blue (B) arrayed on one surface of an insulating substrate 11 made of a glass substrate or the like, such that the color pixels are sequentially and repeatedly arrayed in the horizontal direction over a plural number (a multiple of 3) of columns, and are arrayed in the vertical direction over a plural number of rows on the basis of a single color in each column. Here, adjoining color pixels PXr, PXg, and PXb having the three colors form a group and constitute one display pixel PIX.

Regions (surrounded-regions) each made up of pixel forming regions of a plurality of color pixels PXr, PXg, or PXb, among the plurality of display pixels PIX (color pixels PXr, PXg, and PXb) two-dimensionally arrayed on the one surface of the insulating substrate 11, that are arrayed in the vertical direction of the diagram and thus unified in color, are defined on the display panel 10 by a bank (partitioning wall) 18 provided on the one surface of the insulating substrate 11 so as to project therefrom to form a planar pattern having a fence-like or a lattice-like shape. The shapes of the surrounded-regions are, for example, stripe or rectangle. The pixel forming regions, which are included in each such defined region and in which a plurality of color pixels PXr, PXg, or PXb are formed, are each provided with a pixel electrode 15.

As shown in FIG. 2, each of the color pixels PXr, PXg, and PXb included in each display pixel PIX comprises, on the insulating substrate 11, a light emission drive circuit DC formed by one or a plurality of transistor(s) (for example, amorphous silicon thin film transistor(s) or the like), and an organic EL element (light emitting element) OEL which is driven to emit light when a light emission drive current generated by the light emission drive circuit DC is supplied to the pixel electrode 15.

As shown in, for example, FIG. 2, the light emission drive circuits DC are arranged near the intersections of supply voltage lines (for example, anode lines) La laid in the row direction (the left and right direction in the diagram) and common voltage lines (for example, cathode lines) Lc laid in the column direction (the upward and downward direction in the diagram) on the display panel 10 (insulating substrate 11).

Each supply voltage line La is directly or indirectly connected to, for example, a predetermined high potential power source, and applies a predetermined high voltage (supply voltage Vsc) to the pixel electrodes (for example, an anode terminal or an anode electrode) of the organic EL elements OEL provided for each display pixel PIX (color pixels PXr, PXg, and PXb) for making a gradation current Idata corresponding to display data flow through the pixel electrodes. Each common voltage line Lc is directly or indirectly connected to, for example, a predetermined low potential power source, and applies a predetermined low voltage (common voltage Vcom; for example, a grounding voltage Vgnd) to an opposing electrode (for example, a cathode terminal or a cathode electrode) of the organic EL elements OEL.

As shown in, for example, FIG. 2, the light emission drive circuit DC comprises a transistor Tr11 whose gate terminal is connected to a selecting line Ls laid in the row direction of the display panel 10 (insulating substrate 11), whose drain terminal is connected to the above-described supply voltage line La, and whose source terminal is connected to a connection node N11, a transistor Tr12 whose gate terminal is connected to the selecting line Ls, whose source terminal is connected to a data line Ld laid in the column direction of the display panel 10, and whose drain terminal is connected to a connection node N12, a transistor Tr13 whose gate terminal is connected to the connection node N11, whose drain terminal is connected to the supply voltage line La, and whose source terminal is connected to the connection node N12, and a capacitor Cs connected between the connection node N11 and the connection node N12 (between the gate and source of the transistor Tr13). The transistors Tr11 to Tr13 are all an n-channel type thin film transistor.

The organic EL element OEL has its anode terminal (pixel electrode 15) connected to the connection node N12 of the above-described light emission drive circuit DC, and has its cathode terminal (opposing electrode) connected to the common voltage line Lc laid in the column direction of the display panel 10. In FIG. 2, the capacitor Cs is a parasitic capacitor (retained capacitance) generated between the gate and source of the transistor Tr13, or an auxiliary capacitor added between the gate and source of the transistor Tr13.

In the light emission drive circuit DC shown in FIG. 2, the selecting line Ls is connected to an unillustrated selecting driver, a selecting signal Ssel for setting the plurality of display pixels PIX (color pixels PXr, PXg, and PXb) arrayed in the row direction of the display panel 10 to a selected state at a predetermined timing is applied to the selecting line Ls. The supply voltage line La is connected to an unillustrated power source driver, and a predetermined supply voltage Vsc is applied to the display pixels PIX arrayed in the same row at the timing synchronous with the selecting signal Ssel. The data line Ld is connected to an unillustrated data driver, and supplied with a gradation current Idata corresponding to display data at a timing synchronous with when the display pixels PIX are selected.

The drive control operation for the display pixels PIX (display panel 10), which comprise the light emission drive circuit DC having the above-described circuit structure, starts with the unillustrated selecting driver applying a selecting signal Ssel of selecting level (high level) to the selecting line Ls in a writing operation period, and the unillustrated power source driver applying a low-level supply voltage Vsc having an inverting polarity to the supply voltage line (anode line) La in synchronization with the selecting signal Ssel. In synchronization with this timing, the unillustrated data driver controls a gradation current Idata having a current value corresponding to display data to flow through the data line Ld. That is, the data driver is a driver for controlling the current value of the gradation current Idata corresponding to display data, and lowers the potential of the data line Ld with respect to the supply voltage Vsc, which is a fixed voltage, to make the gradation current Idata flow as withdrawn in the direction from the display pixels PIX (light emission drive circuits DC) to the data line Ld.

In response to the selecting signal Ssel output from the selecting driver in the writing operation period, the transistors Tr11 and Tr12 of the light emission drive circuit DC are turned on, so that the supply voltage Vsc of low level is applied to the connection node N11 while a voltage level at a lower potential than the supply voltage Vsc of low level is applied through the transistor Tr12 to the connection node N12 due to the withdrawing of the gradation current Idata, thereby the gradation current Idata set by the data driver is forced to flow through the transistor Tr13. Generally, the current value of a current flowing across the drain and source of an n channel type transistor is dependent on the potential between the gate and source thereof. At this time, the transistor Tr13 has a potential difference corresponding to the current value of the gradation current Idata automatically set between the connection node N11 and the connection node N12 (between the gate and source of the transistor Tr13).

At this time, a charge corresponding to the potential difference that occurs between the connection node N11 and the connection node N12 is stored in the capacitor Cs and retained (charged) therein as a voltage component. The amount of the stored charge is automatically set according to the current value of the gradation current Idata flowing across the drain and source of the transistor Tr13 in the writing operation period. At this time, since the supply voltage Vsc of low level is equal to or lower than the common voltage Vcom (grounding voltage Vgnd) applied to the cathode terminal through the common voltage line (cathode line) Lc, the gradation current Idata flows from the supply voltage line La to the data line L without flowing to the organic EL element OEL through the drain and source of the transistor Tr13. Therefore, the current value of the gradation current Idata flowing across the drain and source of the transistor Tr13 in the writing operation period is equal to the current value of the gradation current Idata flowing into the data line Ld in the writing operation period. Accordingly, since no forward bias voltage is applied to the organic EL element OEL, no light emission drive current flows through the organic EL element OEL in the writing operation period, with no light emission effected.

Next, in a light emitting operation period, the selecting driver applies a selecting signal Ssel of non-selecting level (low level) to the selecting line Ls, and the power source driver applies a supply voltage Vsc of high level to the supply voltage line La. In synchronization with this timing, the data driver stops withdrawing the gradation current Idata.

In response to this, the transistors Tr11 and Tr12 are turned off to stop the supply voltage Vsc from being applied to the connection node N11 and stop the voltage level originating from the withdrawal of the gradation current Idata from being applied to the connection node N12. Thus, the capacitor Cs retains the charge stored therein in the above-described writing operation.

With the capacitor Cs retaining the charge (charging voltage) stored therein in the writing operation period, the potential difference between the connection node N11 and the connection node N12 (between the gate and source of the transistor Tr13) is maintained, which keeps the transistor Tr13 in a state that it can let out a current having a current value corresponding to the current value of the gradation current Idata to flow. When a supply voltage Vsc having a predetermined voltage value which is at a higher voltage level than the common voltage Vcom (grounding voltage Vgnd) and which would sufficiently increase the potential difference between the drain and source of the transistor Tr13 so as to make the current flowing through the transistor Tr13 saturated during the light emitting operation period is applied to the supply voltage line La, the transistor Tr13 lets out a light emission drive current corresponding to the current value of the gradation current Idata which flowed in the writing operation period to flow into the organic EL element OEL in the forward biasing direction, due to the potential difference between the gate and source of the transistor Tr13 originating from the charge stored in the writing operation period. Thus, the organic EL element OEL emits light having luminance corresponding to the gradation current Idata, and consequently corresponding to the display data.

That is, since the capacitor Cs retains the charging voltage stored therein in the writing operation period until the light emitting operation, the transistor Tr13 keeps retaining the state of flowing the gradation current Idata, which state was controlled by the data driver in the writing operation period, even after the transistor Tr12 is turned off in the light emitting operation period to get the electrical connection to the data driver cut. Therefore, the current value of the light emission drive current that flows into the organic EL element OEL in the light emitting operation period follows the current value of the gradation current Idata, and the organic EL element OEL continues light emitting operation at a desired luminance gradation corresponding to the display data until the next writing operation period.

With this series of drive control operation repeatedly performed for all the display pixels PIX (color pixels PXr, PXg, and PXb) two-dimensionally arrayed on the display panel 10 sequentially, for example, row by row, an image display operation for displaying desired image information can be performed.

(Device Structure of Display Pixel)

Next, a specific device structure (plan layout and cross sectional structure) of the display pixel (the light emission drive circuit and the organic EL element) having the above-described circuit structure will be explained.

Figure 3:
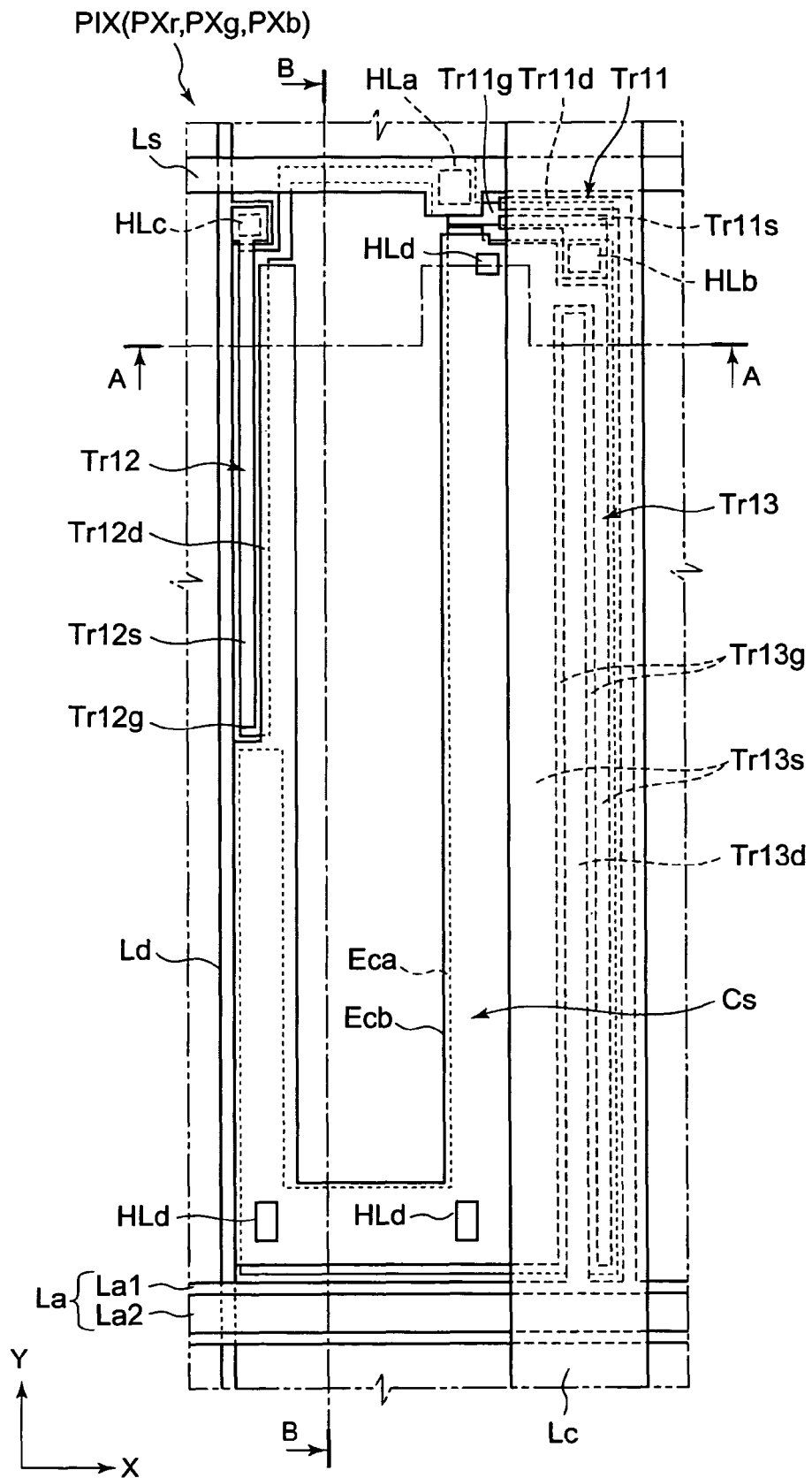
FIG. 3 is a plan layout diagram showing an example of the structure of a display pixel applicable to the display device (display panel) according to an embodiment of the present invention.
Figure 4:
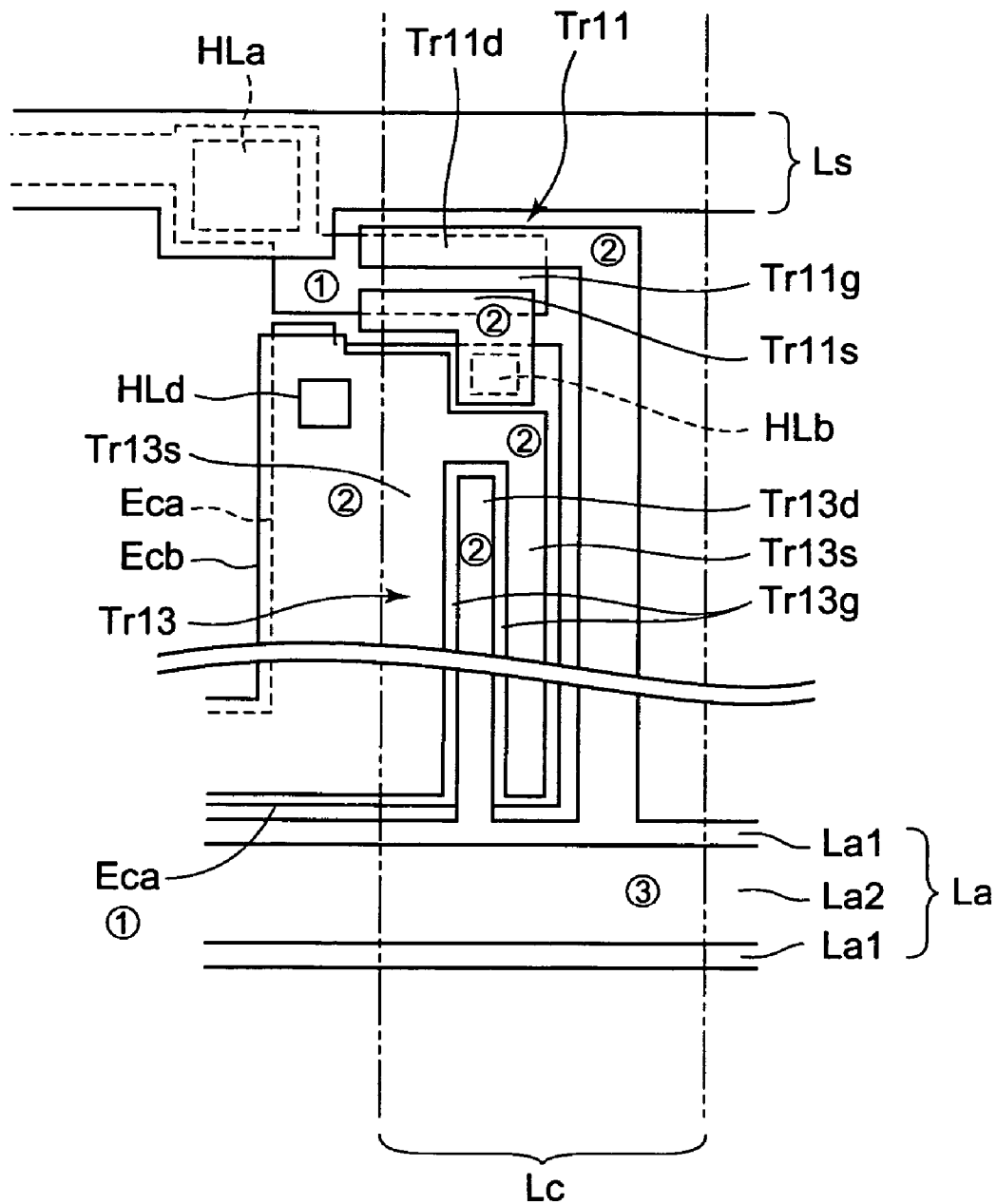
FIG. 4 is a diagram showing the details of a principal part of the plan layout of the display pixel according to the present embodiment.
Figure 5:
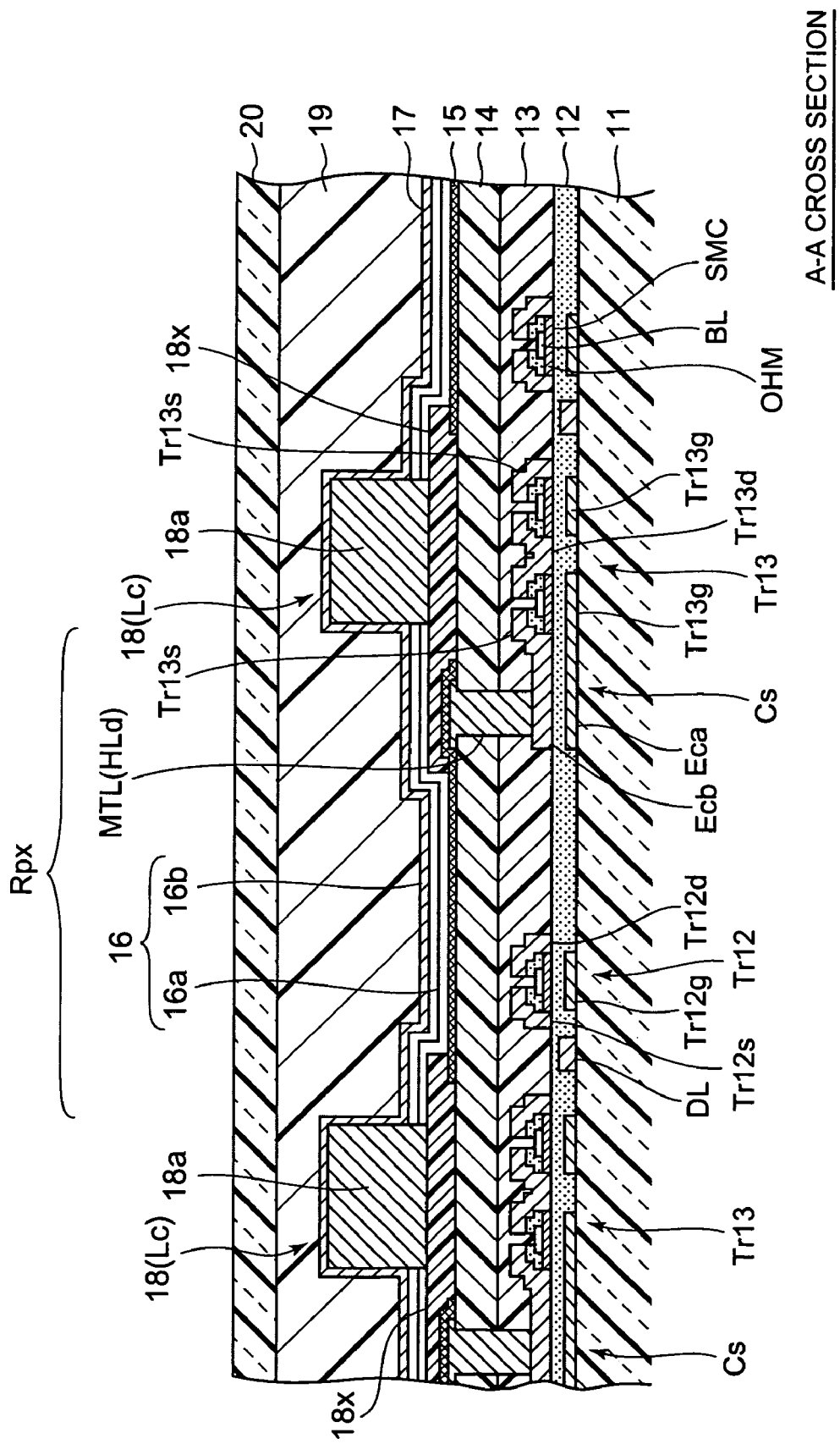
FIG. 5 is a schematic cross sectional diagram showing an A-A cross section of the display pixel PIX having the plan layout according to the present embodiment.
Figure 6:
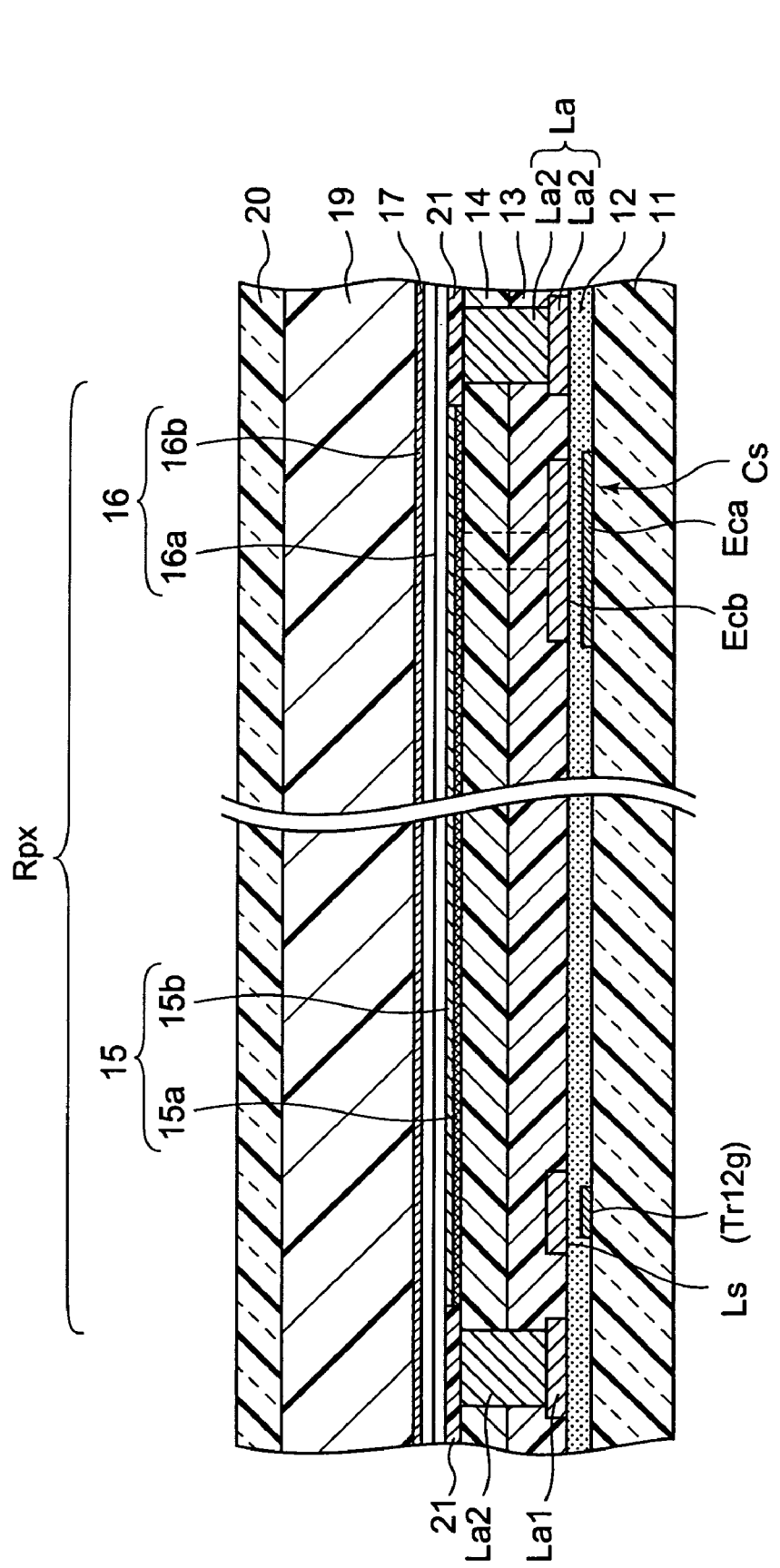
FIG. 6 is a schematic cross sectional diagram showing a B-B cross section of the display pixel PIX having the plan layout according to the present embodiment.

FIG. 3 is a plan layout diagram showing an example of a display pixel that can be used for the display device (display panel) according to the present embodiment. FIG. 4 is a detailed diagram of a principal part extracted from the plan layout of the display pixel according to the present embodiment. Here, the plan layout of a specific one of the color pixels PXr, PXg, and PXb of red (R), green (G), and blue (B) of a display pixel PIX shown in FIG. 1 is shown. FIG. 3 mainly shows the layers on which the transistors of the light emission drive circuit DC and wiring layers are formed. FIG. 4 specifically shows transistors, wiring layers, etc. formed on the layer under the layer of the common voltage line Lc. In FIG. 4, the encircled numbers indicates the order of the vertical levels of conductive layers (including wiring layers), where smaller numbers indicate layers formed at lower levels (closer to the insulating substrate 11), while larger numbers indicate layers formed at higher levels (closer to the observer side). FIGS. 5 and 6 are schematic cross sectional diagrams showing an A-A cross section and a B-B cross section of the display pixel PIX having the plan layout shown in FIG. 3.

Specifically, the display pixel PIX (color pixels PXr, PXg, and PXb) shown in FIG. 2 is provided, in the pixel forming regions (regions in which the color pixels PXr, PXg, and PXb are formed respectively) Rpx defined on the one surface of the insulating substrate 11, with the selecting line Ls and the supply voltage line La which extend along the upper and lower edges of the plan layout shown in FIG. 3 in the X direction (the left and right direction) respectively, and the data line Ld and the common voltage line Lc which extend along the left and right edges of the plan layout in the Y direction (the upward and downward direction) so as to cross the selecting line Ls and supply voltage line La perpendicularly.

As shown in FIG. 3 and FIG. 4, the supply voltage line La is formed on a lower level (closer to the insulating substrate 11) than the common voltage line Lc, and the selecting line Ls and the data line Ld are formed on a lower level than the supply voltage line La. The selecting line Ls is formed together with the source and drain of the transistors Tr11 to Tr13, by patterning a source and drain metal layer for forming the source and drain. The data line Ld is formed together with the gate of the transistors Tr11 to Tr13, by patterning a gate metal layer for forming the gate.

Specifically, as shown in FIG. 5 and FIG. 6, the display pixel PIX is built by forming wiring layers of various types including the light emission drive circuits DC, the plurality of transistors Tr11 to Tr13 and the capacitors Cs in the display pixel PIX, and the selecting line Ls and the data line Ld on the insulating substrate 11, and forming thereabove, via a protective insulating film 13 and flattening film 14 sequentially formed to cover the transistors Tr11 to Tr13 and wiring layers, the organic EL elements OEL, which comprise the pixel electrodes (for example, anode electrodes) 15 connected to the light emission drive circuits DC to be supplied with a predetermined light emission drive current, an organic EL layer 16, and the opposing electrode (for example, a cathode electrode) 17 to which the common voltage Vcom is applied.

To be more specific, in the light emission drive circuit DC, the transistor Tr11 shown in FIG. 2 is formed to extend in the X direction along the selecting line Ls, the transistor Tr12 is formed to extend in the Y direction along the data line Ld, and the transistor Tr13 is formed to extend in the Y direction along the common voltage line Lc, as shown in FIG. 3 and FIG. 4.

Particularly, the transistors Tr11 and Tr13 are arranged on a lower level than the common voltage line Lc formed on the flattening film 14, such that they are overlaid with the common voltage line Lc in the plan-view perspective, as shown in FIG. 3 to FIG. 5. The transistors Tr11 to Tr13 have the structure of a known field effect transistor, and comprise gate electrodes Tr11g to TR13g formed on the insulating substrate 11, semiconductor layers SMC formed at regions corresponding respectively to the gate electrodes Tr11g to TR13g via a gate insulating film 12, and source electrodes Tr11s to Tr13s and drain electrodes Tr11d to Tr13d formed to extend at both ends of the semiconductor layers SMC.

A block layer BL made of silicon oxide, silicon nitride, or the like for preventing edging damages onto the semiconductor layer SMC is formed on the semiconductor layer SMC where the source electrode and drain electrode of each of the transistors Tr11 to Tr13 are opposed to each other. An impurity layer OHM for realizing ohmic connection between the semiconductor layer SMC and the source and drain electrodes is formed on the semiconductor layer SMC where it is contacted by the source electrode and the drain electrode. The gate electrodes Tr11g to Tr13g of the transistors Tr11 to Tr13 are all formed by patterning the same gate metal layer. The source electrodes Tr11s to Tr13s and drain electrodes of Tr11d to Tr13d of the transistors Tr11 to Tr13 are all formed by patterning the same source and drain metal layer.

Then, to match with the circuit structure of the light emission drive circuit DC shown in FIG. 2, the transistor Tr11 has its gate electrode Tr11g connected to the selecting line Ls through a contact hole HLa formed in the gate insulating film 12, has its source electrode Tr11s connected an electrode Eca of the capacitor Cs at one end side (the side of the connection node N11) thereof through a contact hole HLb formed in the gate insulating film 12, and has its drain electrode Tr11d formed integrally with the wiring layer (lower wiring layer) La1 of the supply voltage line La, as shown in FIG. 3 and FIG. 4.

Further, as shown in FIG. 3 to FIG. 5, the transistor Tr12 has its gate electrode Tr12g connected to the selecting line Ls through the contact hole HLa, has its source electrode Tr12s connected to the data line Ld through a contact hole HLc formed in the gate insulating film 12, and has its drain electrode Tr12d formed integrally with an electrode Ecb of the capacitor Cs at the other end side (the side of the connection node N12) thereof.

As shown in FIG. 3 to FIG. 5, the transistor Tr13 has its gate electrode Tr13g formed integrally with the electrode Eca of the capacitor Cs at the one end side (the side of the connection node N11) thereof, has its source electrode Tr13s formed integrally with the electrode Ecb of the capacitor Cs at the other end side (the side of the connection node N12) thereof, and has its drain electrode Tr13d formed integrally the supply voltage line La.

The capacitor Cs is built up by extending the electrode Eca at the one end side formed integrally with the gate electrode Tr13g of the transistor Tr13, and extending the electrode Ecb at the other end side formed integrally with the source electrode Tr13s, such that the electrode Eca and the electrode Ecb face each other via the gate insulating film 12.

Further, as shown in FIG. 5, a contact hole HLd is formed in the protective insulating film 13 and flattening film 14 above the source electrode Tr13s of the transistor Tr13 (the electrode Ecb of the capacitor Cs), and a metallic material (contact metal MTL) is filled in the contact hole HLd so that the source electrode Tr13s and the pixel electrode 15 of the organic EL element OEL may be electrically connected to each other.

As shown in FIG. 3, FIG. 4, and FIG. 6, the supply voltage line (anode line) La has a two-layered stacked wire structure of, for example, a wiring layer (lower wiring layer) La1 on the lower layer, and a wiring layer (upper wiring layer) La2 on the upper layer. The wiring layer La1 on the lower layer extends over the gate insulating film 12 and is formed integrally with the drain electrode Tr11d of the transistor Tr11 and the drain electrode Tr13d of the transistor Tr13. The wiring layer La2 on the upper layer is filled in a wiring groove formed in the protective insulating film 13 and flattening film 14 to be electrically connected to the lower wiring layer La1, and is formed in the left and right direction (row direction) of the FIG. 1 and FIG. 3. The top surface of the upper wiring layer La2 is insulated by a cap layer 21 made of silicon nitride or the like.

As shown in FIG. 5 and FIG. 6, the organic EL element, which is formed by sequentially stacking the pixel electrode 15 functioning as, for example, the anode electrode, the organic EL layer 16 comprising a hole transporting layer 16a (carrier transporting layer) and an electron-transporting light emitting layer 16b (carrier transporting layer), and the opposing electrode 17 functioning as, for example, the cathode electrode, is formed on the flattening film 14 in each pixel forming region Rpx. In a case where the display panel 10 is of a bottom emission structure for letting out the light emitted from the organic EL layer 16 of each display pixel PIX (color pixels PXr, PXg, and PXb) through the insulating substrate 11 on which the light emission drive circuit DC is formed, the pixel electrode 15 has optical transparency and the opposing electrode 17 has light reflectivity. In a case where the display panel 10 is of a top emission structure for letting out the light emitted from the organic EL layer 16 of each display pixel PIX (color pixels PXr, PXg, and PXb) through a sealing substrate 20 to be described later, the pixel electrode 15 at least has light reflectivity while the opposing electrode 17 has optical transparency. In this case, the pixel electrode 15 may have an electrode structure constituted by a single-layer conductive layer having light reflectivity, or may have a stacked structure made up of, for example, a reflective metal layer and a metal oxide layer, as will be explained in a later-described manufacturing method.

The bank 18 for defining the region in which the organic EL elements OEL are formed (strictly, the region in which the organic EL layer 16 is formed) is formed between the pixel forming regions Rpx (strictly, on the boundary region between the regions in which the organic EL elements OEL of each display pixel PIX are formed), such that the bank 18 projects from the flattening film 14 (insulating substrate 11). The bank 18 comprises row banks extending row directions and column banks extending column directions and crossing with the row banks. According to the present embodiment, as shown in FIG. 5 and FIG. 6, the bank 18 has a stacked structure made up of a base layer 18x on a lower layer also functioning as an interlayer insulating film between the pixel forming regions Rpx, and a bank metal portion (layer) 18a (common voltage line (cathode line) Lc) on an upper layer made of a conductive material.

To be more specific, the bank 18 is formed by providing the base layer 18x made of a silicon nitride film (SiN) or the like on the flattening film 14 exposed about the boundary between adjoining display pixels PIX, such that the base layer 18x partially extends over the pixel electrode 15 of the organic EL element OEL, and by stacking the bank metal portion 18a made of a conductive material (for example, a metallic material) on the base layer 18x so as to project therefrom.

Particularly, according to the present embodiment, by the bank 18, which has the stacked structure, being formed on the display panel 10 (insulating substrate 11) so as to have a planar pattern of a fence-like or lattice-like shape as shown in FIG. 1, the pixel forming regions of the plurality of display pixels PIX (the regions in which the organic EL layers 16 of the organic EL elements OEL are formed) arrayed in the column direction (the upward and downward direction in the diagram) are defined, and the bank metal portion 18a of the bank 18 can function as a wiring layer (common voltage line Lc) which can apply a predetermined voltage (common voltage Vcom) simultaneously to the display pixels PIX (organic EL elements OEL) arrayed all over the display panel 10.

That is, by the opposing electrode (cathode electrode) 17 of the organic EL element OEL being formed so as to extend on the bank 18 having the bank metal portion 18a, and by the opposing electrode 17 being joined to the bank metal portion 18a of the bank 18 so as to be electrically connected thereto as shown in FIG. 5 and FIG. 6, the bank 18 (bank metal portion 18a) can also function as the common voltage line Lc to be used as a common cathode line.

As shown in FIG. 5 and FIG. 6, a sealing substrate 20 made of a glass substrate or the like is joined, via a transparent sealing resin layer 19, to the insulating substrate 11 on which the light emission drive circuits DC, the organic EL elements OEL, and the bank 18 are formed, so as to face the insulating substrate 11.

On such a display panel 10 having the light emission drive circuit DC comprising wiring layers such as the transistors Tr11 to Tr13, the capacitor Cs, the selecting line Ls, the data line Ld, the supply voltage line (anode line) La, etc. which are formed on lower layers (layers of the organic EL element OEL that are closer to the insulating substrate 11) of the display panel 10, when a light emission drive current having a predetermined current value flows across the drain and source of the transistor Tr13 based on the gradation current Idata corresponding to display data supplied through the data line Ld and when this light emission drive current is then supplied from the transistor Tr13 (source electrode Tr13s) to the pixel electrode 15 of the organic EL element OEL through the contact hole HLd (contact metal MTL), the organic EL element OEL of each display pixel PIX (color pixels PXr, PXg, and PXb) emits light at a desired luminance gradation corresponding to the display data.

At this time, in case of the display panel 10 shown in the present embodiment, i.e., in a case where the pixel electrode 15 has light reflectivity and the opposing electrode 17 has optical transparency (that is, in a case where the organic EL element OEL is the top emission type), the light emitted from the organic EL layer 16 of each display pixel PIX (color pixels PXr, PXg, and PXg) is let out to the one surface side (the upper side in FIG. 5 and FIG. 6) of the insulating substrate 11 (display panel 10) directly through the opposing electrode 17 having optical transparency, or after being reflected on the pixel electrode 15 having light reflectivity.

On the other hand, in a case where the pixel electrode 15 of the organic EL element OEL formed on the display panel 10 has optical transparency and the opposing electrode 17 has light reflectivity, i.e., in a case where the organic EL element OEL is the bottom emission type, the light emitted from the organic EL layer 16 of each display pixel PIX (color pixels PXr, PXg, and PXb) is let out to the side of the other surface (the lower side in FIG. 5 and FIG. 6) directly through the display pixel 15 having optical transparency, or after being reflected on the opposing electrode 17 having light reflectivity.

Regarding the display pixel PIX according to the present embodiment, such a device structure has been shown, in which only the transistors Tr11 and Tr13 of the light emission drive circuit DC are formed on a lower layer than the bank 18 (bank metal portion 18a) functioning as the common voltage line Lc, as shown in FIG. 3 and FIG. 4. The present invention is not limited to this device structure, but all or most of the transistors Tr11 to Tr13 and wiring layers etc. may be arranged on a lower layer than the bank 18, which defines the pixel forming region Rpx of the display pixel PIX. In this case, the organic EL element OEL of the above-described top emission type can radiate the light emitted from the organic EL layer 16 to the one surface side of the insulating substrate 11 with the light not blocked (shielded) by the transistors Tr11 to Tr13 of the light emission drive circuit DC, or with the amount of light to be shielded suppressed, making it possible to realize a display panel having a sufficient aperture ratio.

(Manufacturing Method of Display Device)

Next, the manufacturing method of the above-described display device (display panel) will be explained.

FIGS. 7A to 7H are cross sectional diagrams of manufacturing steps showing one example of the manufacturing method of the display device (display panel) according to the present embodiment. Here, FIGS. 7A to 7H show cross sectional diagrams of manufacturing steps for the cross section taken along the A-A line shown in FIG. 3. FIG. 8 is a schematic structure diagram for explaining a heating/drying process included in the manufacturing method of the display device (display panel) according to the present embodiment. In the following manufacturing method, a display device comprising a display panel having the above-described top emission type light emitting structure will be explained. However, it is also possible to manufacture a display panel having a bottom emission type light emitting structure, by following a similar manufacturing method. In FIG. 8, liquid containing organic compound (hereinafter called organic compound containing liquid) coating lines show positions of the pixel forming regions Rpx surrounded by the bank 18, specific regions Rtmh in which the bank 18 positioned at the end of the pixel forming regions Rpx and which include corners of the pixel forming regions, and a substrate stage STG, at which positions an ink jetting device for jetting a plurality of separate liquid drops onto predetermined positions or a nozzle printing device for flowing out a continual liquid moves its head and coats an organic compound containing liquid. Like this, by the head not stopping coating immediately after it goes out from the pixel forming region Rpx but keeping coating even after it goes out from the pixel forming region Rpx, it is possible to stably supply the organic compound containing liquid of a predetermined amount onto the entire area of the pixel forming region Rpx.

Figure 7A:
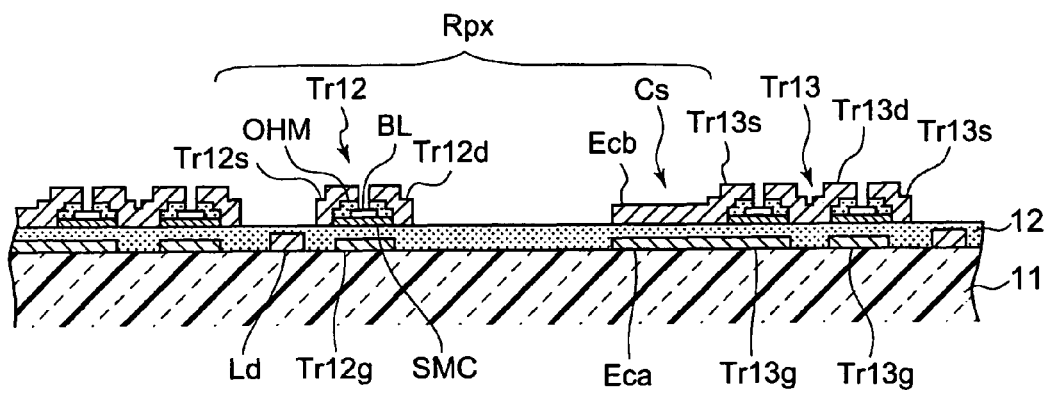
FIGS. 7A to 7H are cross sectional diagrams for explaining a manufacturing method of the display device (display panel) according to the present embodiment.
Figure 8:
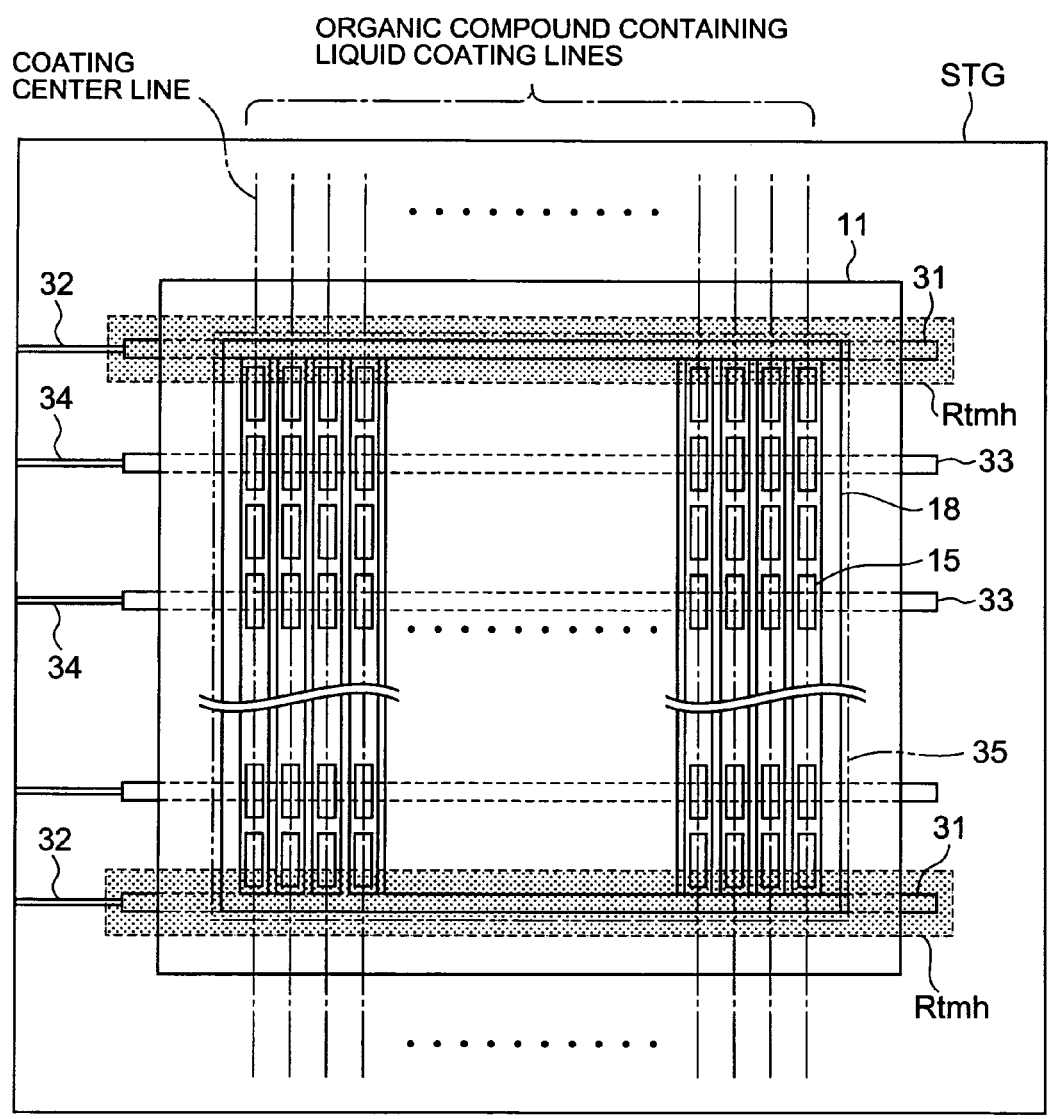
FIG. 8 is a schematic structure diagram for explaining a heating/drying process in the manufacturing method of the display device (display panel) according to the present embodiment.

According to the manufacturing method of the above-described display device (display panel), first, as shown in FIG. 7A, the transistors Tr11 to Tr13 and capacitor Cs of the light emission drive circuit DC and various wiring layers, etc. are formed on the pixel forming region Rpx of the display pixel PIX (color pixels PXr, PXg, and PXb) that is defined on the one surface side (the upper side in the drawing) of the insulating substrate 11 made of a glass substrate or the like. Specifically, the gate electrodes Tr11g to Tr13g, the electrode Eca at the one end side of the capacitor Cs that is formed integrally with the gate electrode Tr13g, and the data line Ld are formed on the insulating substrate 11 by patterning a same gate metal layer, and the gate insulating film 12 is then formed to cover the entire region of the insulating substrate 11.

Next, the semiconductor layer SMC made of, for example, amorphous silicon, polysilicon, or the like is formed on the gate insulating film 12 at regions corresponding to the gate electrodes Tr11g to Tr13g, and the source electrodes Tr11s to Tr13s and drain electrodes Tr11d to Tr13d are formed at both ends of the semiconductor layer SMC via the impurity layer OHM for ohmic connection. At this time, by patterning a same gate metal layer, the electrode Ecb at the other end side of the capacitor Cs that is connected to the source electrode Tr13s and drain electrode Tr12d, the selecting line Ls (see FIG. 6), and the lower wiring layer La1 (see FIG. 6) of the supply voltage line La that is connected to the drain electrodes Tr11d and Tr13d are simultaneously formed.

Here, the source electrodes Tr11s to Tr13s, the drain electrodes Tr11d to Tr13d, and the selecting line Ls may have a structure of stacked wires made of, for example, aluminum alloy and transition metal, with a view to reducing the wiring resistance and reducing migration.

Figure 7B:
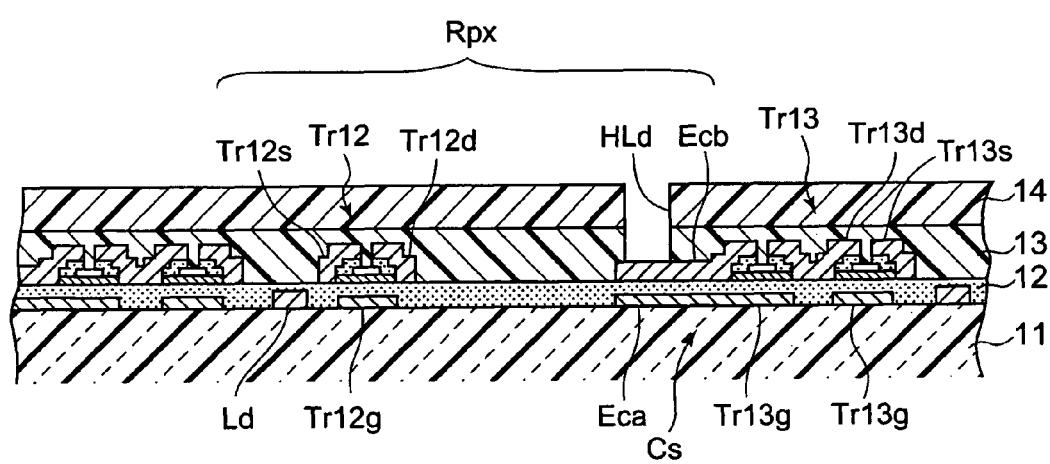

Next, as shown in FIG. 7B, the protective insulating film (passivation film) 13 made of silicon nitride (SiN) or the like and the flattening film 14 made of an insulating material or the like are sequentially formed on the insulating substrate 11 so as to entirely cover the one surface of the insulating substrate 11 including the transistors Tr11 to Tr13, the capacitor Cs, the selecting line Ls, and the lower wiring layer La1 of the supply voltage line La, and thereafter, the contact hole HLd in which the upper surface of the source electrode Tr13s of the transistor Tr13 (light emission drive transistor) (or the upper surface of the electrode Ecb at the other end side of the capacitor Cs) is exposed, and the wiring groove (unillustrated) in which the upper surface of the lower wiring layer La1 of the supply voltage line La is exposed, are simultaneously or sequentially formed so as to penetrate through the flattening film 14 and the protective insulating film 13.

Here, of the protective insulating film 13 and the flattening film 14, at least the flattening film 14 is formed by using a photosensitive resin material, which is often used in an exposure step (photolithography technique) in a semiconductor manufacturing process, etc. This enables the contact hole HLd and the wiring groove of the supply voltage line La, which both penetrate through the flattening film 14 and protective insulating film 13, to be formed by exposing and patterning the flattening film 14 while using a photo mask having a predetermined pattern corresponding to the contact hole HLd and wiring groove of the supply voltage line La and then etching out the protective insulating film 13 on the lower layer by using the flattening film 14 as a mask.

Figure 7C:
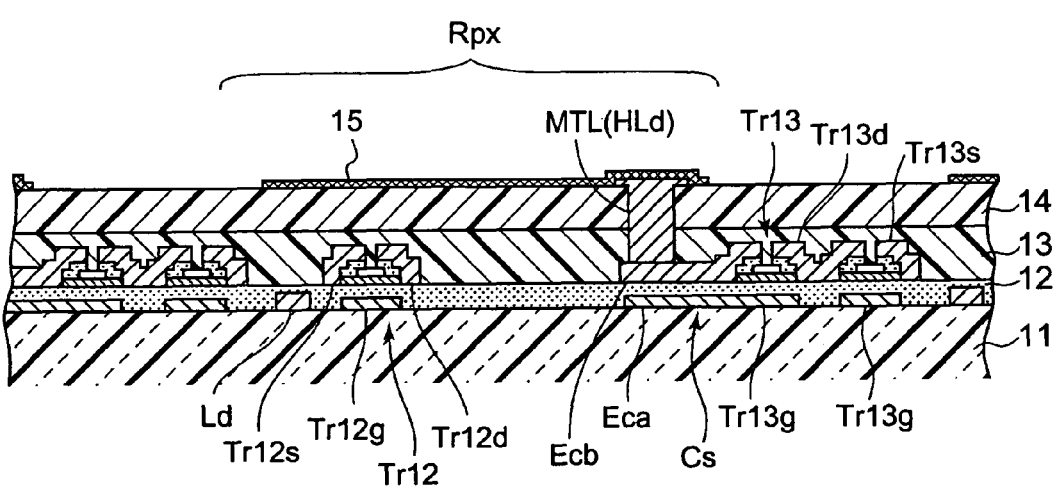

Then, as shown in FIG. 7C, the contact metal MTL is filled in the contact hole HLd and a conductive material (metallic material or the like) for forming the upper wiring layer La2 of the supply voltage line La is simultaneously filled in the wiring groove, and then the cap layer 21 is formed on the upper wiring layer La2. The contact metal MTL and the upper wiring layer La2 can also be deposited by electrolytic plating, etc. Then, the pixel electrode 15, which is electrically connected to the contact metal MTL, is formed on the regions where the organic EL elements OEL are formed (that is, the regions except the boundary between adjoining display pixels PIX, or the regions surrounded by the bank 18 described later). Here, in a case where the display panel 10 is of the top emission structure, the pixel electrode 15 can have an electrode structure in which, for example, a reflective metal layer having light reflectivity and a metal oxide layer having optical transparency are stacked.

Specifically, for example, after a reflective metal layer having light reflectivity such as aluminum (Al), etc. is thinly formed and patterned, a metal oxide layer such as indium tin oxide (ITO), indium zinc oxide, etc. is thinly formed and patterned to cover the reflective metal layer. In order to cause no cell reaction between the metal oxide layer on the upper layer and the reflective metal layer on the lower layer and to prevent the reflective metal layer on the lower layer from being over-etched or damaged by etching in patterning the metal oxide layer on the upper layer, it is preferred that the film to be the metal oxide layer be formed after the reflective metal layer is patterned to cover the reflective metal layer from exposure, and in this state the metal oxide layer be patterned.

Figure 7D:
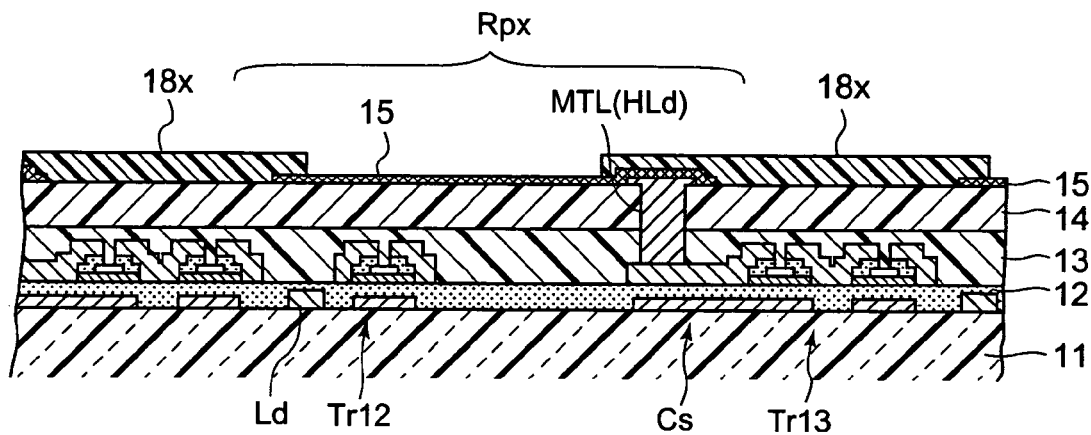

Then, as shown in FIG. 7D, the base layer (interlayer insulating film) 18x made of an inorganic insulating material such as a silicon oxide film, a silicon nitride film, etc. is formed on the regions between the pixel electrodes 15 formed in adjoining display pixels PIX (i.e., the boundary between adjoining display pixels PIX) by using chemical vapor deposition or the like and then patterned, thereby to integrally form a plurality of column bank portions of the bank 18 formed on the display panel 10, which portions extend in the column direction, and row bank portions which cross the column bank portions in the row direction at the both ends of the column bank portions, as shown in FIG. 1. The cap layer 21 may be simultaneously formed with the base layer 18x by patterning the same material film.

Figure 7E:
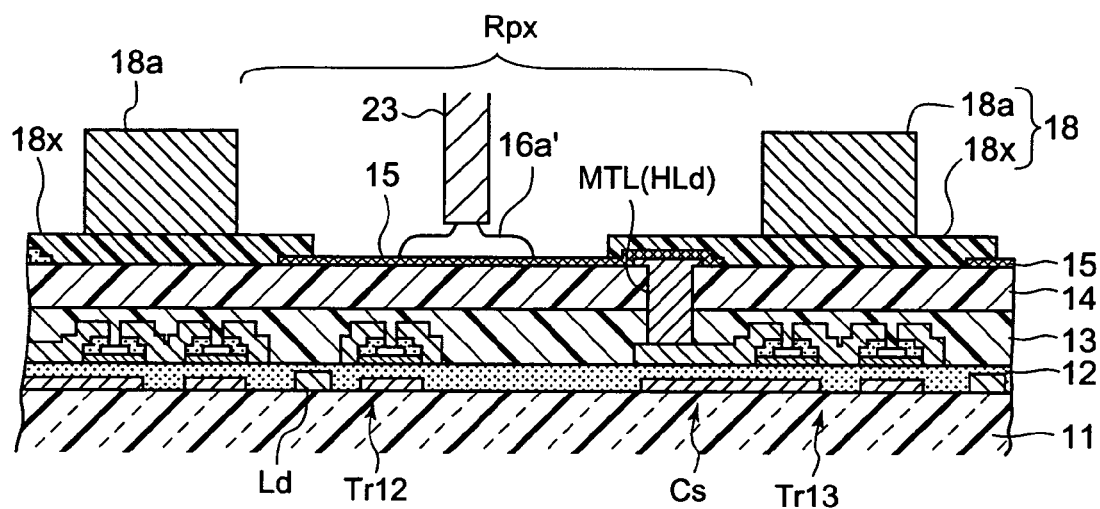

Then, as shown in FIG. 7E, the bank metal portion 18a (common voltage line Lc), whose top surface at least is made of a low-resistance metallic material such as, for example, copper (Cu), silver (Ag), or a single metal or metal alloy whose main component is any of these, is formed on the column bank portions and row bank portions of the base layer 18x. Here, an oxidation preventing film made of metal plate or the like may be formed on the surface of the bank metal portion 18a in order to prevent the bank metal portion 18a from being oxidized. The bank metal portion 18a may be plated by using a mask. In this case, after a plating base layer is formed and patterned as the bank metal portion 18a by sputtering, this plating base layer that is exposed through a mask may be electrolytic-plated. Further, in order to express liquid repellency on the surface of the bank metal portion 18a, a film of a triazinethiol compound may be formed on the surface of the bank metal portion 18a. Since the triazinethiol compound film formed on the surface is very thin, it does not insulate the bank metal portion 18a. A triazinethiol compound film selectively adheres to a structure, and does not adhere to a metal oxide such as ITO to an extent that the metal oxide shows a sufficient liquid repellency.

Thus, the regions including the pixel forming regions of the plurality of display pixels PIX (organic EL elements OEL), which are arrayed in the column direction of the display panel 10 and thus emit light of the same color, are defined column by column as surrounded by the bank 18 comprising the bank metal portions (metal layer) 18a (common voltage lines Lc) and the base layers 18x (pixel forming region defining step). Accordingly, in a later-described step of forming a light emitting layer (electron-transporting light emitting layer 16b) that constitutes the organic EL layer 16, even if this forming is by coating the solutions of light emitting materials or liquids in which the materials are diffused (liquid materials), the light emitting materials do not mix each other by being separated by the bank 18 between adjoining display pixels PIX (color pixels PXr, PXg, and PXb), making it possible to prevent the colors from being mixed between adjoining color pixels.

Figure 7F:
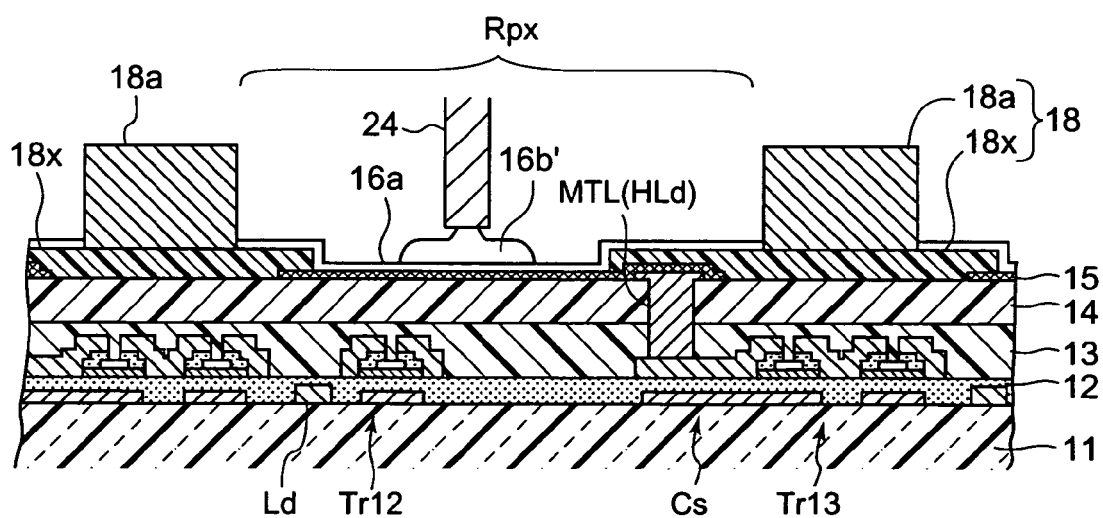
Figure 7G:
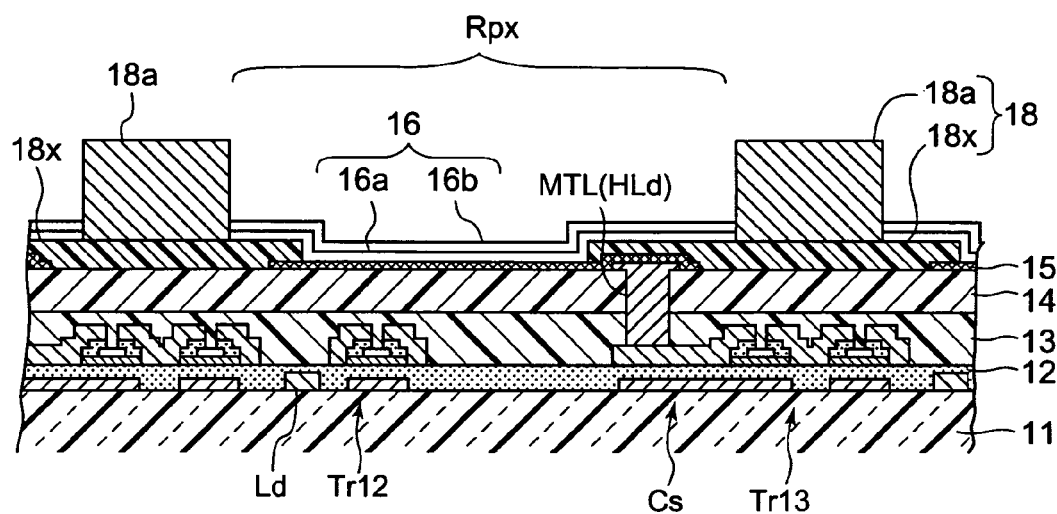

Next, by using printing nozzles 23 for flowing out a continual liquid, a solution 16a of a hole transporting material or a liquid 16a' in which the hole transporting material is diffused is coated on the plurality of pixel forming regions (the regions in which the organic EL elements OEL are formed) for the respective colors, which are surrounded (defined) by the bank 18, i.e., coated on the plurality of pixel electrodes 15 exposed and arrayed in the column direction as shown in FIG. 1 for emitting light of the same color, simultaneously at the same step. The hole transporting layer 16a may be formed by using ink-jetting nozzles for jetting a plurality of separate liquid drops onto predetermined positions. In a case where the hole transporting layer 16a is formed continuously on the plurality of pixels having a stripe shape as shown in FIG. 1, the nozzle printing formation is particularly preferred. In a case where the hole transporting layer 16a is formed pixel by pixel so as to separate between the pixels, the ink jetting formation is preferred. After the solution or the diffuse liquid 16a' is heated and dried to form the hole transporting layer 16a, a solution 16b' of an electron-transporting light emitting material or a liquid 16b' in which the electron-transporting light emitting material is diffused is coated on the hole transporting layer 16a as shown in FIG. 7F, by using printing nozzles 24 for flowing out a continual liquid. The electron-transporting light emitting layer 16b may be formed by using ink-jetting nozzles for jetting a plurality of separate liquid drops onto predetermined positions. In a case where a plurality of pixels forming a stripe shape and emitting light of the same color are continuously arrayed as shown in FIG. 1, the nozzle printing formation is particularly preferred. In a case where pixels of the same light emitting color are discontinuous such as in case of delta pixels, etc., the ink jetting formation is preferred. Then, the solution 16b' is heated and dried to form the electron-transporting light emitting layer 16b as shown in FIG. 7G. In this manner, the organic EL layer (light emitting function layer) 16 having the hole transporting layer 16a and the electron-transporting light emitting layer 16b is obtained (liquid coating step, liquid drying step).

Specifically, for example, polyethylenedioxithiophene/polystyrenesulfonate aqueous solution (PEDOT/PSS; a diffuse liquid obtained by diffusing polyethylenedioxithiophene PEDOT, which is a conductive polymer, and polystyrenesulfonate PSS as a dopant in a water solvent) is coated on the pixel electrodes 15 (metal oxide film) as an organic compound containing liquid (compound containing liquid) which contains an organic high-molecular hole transporting material. Thereafter, this aqueous solution is heated and dried to remove the solvent, thereby to fix the organic high-molecular hole transporting material (carrier transporting material) on the pixel electrodes 15 and form the hole transporting layer 16a as the carrier transporting layer.

Further, for example, a solution obtained by dissolving a light emitting material which contains a conjugated double bond polymer such as polyparaphenylenevinylene, polyflorene, etc. in an organic solvent such as tetraphosphor, tetramethylbenzene, mesitylene, xylene, etc., or in water is coated on the hole transporting layer 16a as an organic compound containing liquid (compound containing liquid) which contains an organic high-molecular electron-transporting light emitting material. Thereafter, this solution is heated and dried to remove the solvent, thereby to fix the organic high-molecular electron-transporting light emitting material (carrier transporting material) on the hole transporting layer 16a and form the electron-transporting light emitting layer 16b, which is a carrier transporting layer and also a light emitting layer.

Particularly, according to the manufacturing method of the display device according to the present embodiment, prior to the step of coating the solution or the diffuse liquid 16a' of the hole-transporting material on the pixel electrodes 15 (metal oxide film) and the step of coating the solution of the electron-transporting light emitting material on the hole transporting layer 16a, the temperature distribution is controlled such that a temperature T1 (first temperature) to be set in the specific regions Rtmh of the substrate stage STG on which the insulating substrate 11 is mounted is higher than a temperature T2 (second temperature) in the other regions, as shown in FIG. 8 (temperature distribution setting step).

Figure 11:
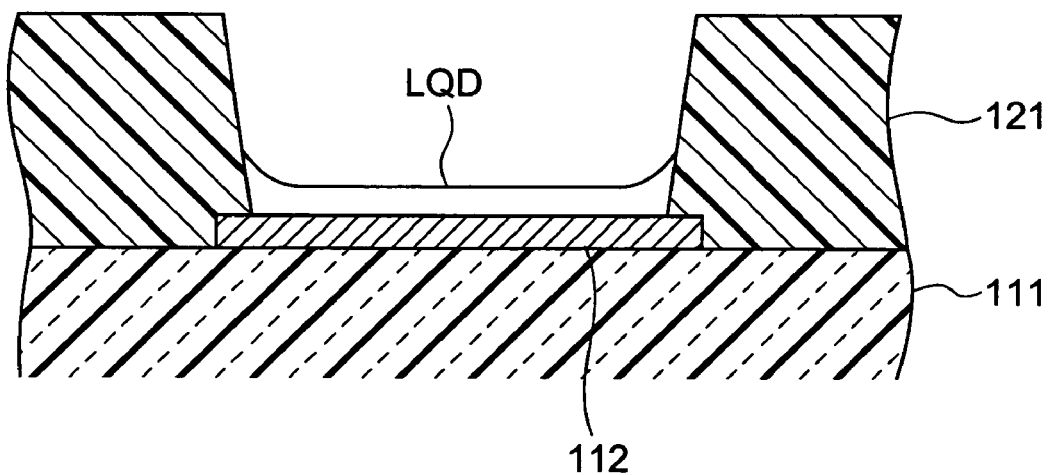
FIG. 11 is a schematic diagram for explaining a problem of a manufacturing process of an organic EL element.

Specifically, in a display region 35 including all the pixel forming regions Rpx, the pixel forming regions Rpx which are positioned in the outermost regions, i.e., the portions of the pixel forming regions Rpx positioned at the four edges of the display region 35, which portions have their three aspects partially surrounded by the bank 18, are comprised in the specific regions Rtmh. The specific regions Rtmh are positioned at the starting end and the finishing end of the organic compound containing liquid coating lines in the display region 35. Since the bank 18 have the characteristic of pressing up the liquid that contacts the surface thereof as shown in FIG. 11, the liquid is more likely to be pressed up in the specific regions Rtmh than in the other regions, i.e., the regions whose two aspects are surrounded by the bank 18. Particularly, since each pixel forming region Tpx is longer in the vertical direction and narrower in the horizontal direction, the adjoining bank 18 that stand on the three aspects are close to each other. Therefore, due to the multiplier effect of the bank 18 on the three aspects, the film to be obtained after the liquid is dried becomes greatly thick, resulting in an uneven film thickness.

According to the present embodiment, the substrate stage STG is provided with two first heaters 31, which are arranged on the portions corresponding to the specific regions Rtmh of the insulating substrate 11 for controlling the specific regions Rtmh to be set at the first temperature T11, and with a plurality of second heaters 33, which are arranged at positions corresponding to the pixel forming regions Rpx except the specific regions Rtmh of the insulating substrate 11 for controlling the pixel forming regions Rpx except the specific regions Rtmh to be set at the second temperature T2 lower than the first temperature T1. The insulating substrate 11 is mounted on the substrate stage STG so as to contact the first heaters 31 and the second heaters 33. Therefore, the specific regions Rtmh can be dried more quickly than the other regions to suppress the solution or the diffuse liquid $16a'$ of the hole transporting material from being pressed up or the solution or the diffuse liquid $16b'$ of the electron-transporting light emitting material from being pressed up. The first heaters 31 and the second heaters 33 are resistors which generate heat. The first heaters 31 are connected to wires 32 for supplying a voltage from the outside, and the second heaters 33 are connected to wires 34 for supplying a voltage from the outside. An external controller appropriately outputs voltages to the wires 32 and wires 34 to control the specific regions Rtmh to be at the first temperature T1 and the pixel forming regions Rpx other than the specific regions Rtmh to be at the second temperature T2. It is preferred that the first temperature T1 is higher than the second temperature T2 by about 5 to 20° C.

In a case where an organic compound containing liquid of 2.0 wt %, in which xylene (having a boiling point of 138 to 145° C.) is the organic solvent, is used, the temperature of the specific regions Rtmh of the substrate stage STG corresponding to the bank 18 that extend in the left and right direction of the diagram is set to 50° C. by the first heater 31, and the temperature of the pixel forming regions Rpx except the specific regions Rtmh is set to 40° C. by the second heater 33. It is preferred that the temperatures of the first heater 31 and second heater 33 be lower than the boiling point of the solvent and also lower than the decomposition temperatures of the carrier transporting material and light emitting material.

By coating the solution or diffuse liquid of the hole transporting material or the solution of the electron-transporting light emitting material on the regions (pixel forming regions) which are defined by the bank 18 and in which the organic EL elements OEL having their respective colors are formed in a state that such a temperature distribution as described above is set, the liquid near the bank 18 included in the specific regions Rtmh is quickly heated and dried. Here, as explained in the summary of the invention described above, according to a manufacturing method for coating an aqueous solution (liquid material) which contains an organic material while the pixel forming regions (regions in which organic EL elements are formed) are defined by bank (partitioning wall) that project from the insulating substrate, there occurs a phenomenon (see FIG. 11) of the ends of the liquid surface of the aqueous liquid that contact the bank being pressed up due to the water repellency of the bank surface and the surface tension of the aqueous solution of the organic material, which raises the problem that the film thickness of the organic EL layers comprising the hole transporting layer and the electron-transporting light emitting layer becomes uneven.

Particularly, in the regions (corresponding to the specific regions Rtmh), shown in FIG. 8, that include the liquid portions (ends of the liquid surface) that contact the bank 18, since the bank 18 form corners in such regions, the solution or the diffuse liquid of the hole transporting material, or the solution of the electron-transporting light emitting material is likely to accumulate and difficult to dry in these regions, which might result in taking a long time to dry. In this case, the solution or the diffuse liquid $16a'$ or $16b'$ is pressed up to invite the hole transporting material or the electron-transporting light emitting material to aggregate therein when the solution or the liquid is dried, to end up in a locally thick deposition.

As compared with this, according to the manufacturing method of the present embodiment, by previously setting the temperature of the regions (corresponding to the specific regions Rtmh) that include the portions (ends of the liquid surface) of the liquid surface of the organic compound containing liquid that contact the bank 18 and thereby are pressed up to form a large thickness, such that the temperature is higher than the temperature of the other regions, the organic compound containing liquid jetted out from the ink jetting device or the nozzle printing device is dried in the regions near the bank 18 as quickly as or more quickly than in the display region 35 except the specific regions Rtmh. Accordingly, the organic compound containing liquid that is adhered to the display region 35 other than the specific regions Rtmh is kept from moving to the specific regions Rtmh and the organic material is mostly fixed where the organic compound containing liquid is coated. Therefore, it is possible to suppress the phenomenon that the organic compound containing liquid concentrates at the ends of the liquid surface (the portions that contact the side surfaces of the bank 18) and presses up the liquid surface, and to improve the evenness of the film thickness of the organic EL layer 16 in about the entire area of the pixel forming region Rpx.

According to the validation by the inventor, etc. of the present invention, in forming the organic EL layer 16 that comprises the hole-transporting layer 16a and the electron-transporting light emitting layer 16b by using the organic compound-containing liquid of the hole transporting material or the electron-transporting light emitting material that has the above-described composition, it was confirmed that by setting the temperature of the specific regions Rtmh provided on the substrate stage STG to have a difference of about 5 to 20° C. from the temperature of the regions other than the specific regions Rtmh, the solvent in the organic compound containing liquid quickly vaporizes and the organic material finely fixes about the location where the liquid is coated, and thereby the organic EL layer 16 that has a uniform film thickness is formed. It is not preferred to raise the temperature of the specific regions Rtmh more than adequate, because effects such as deterioration of the film quality in the pixel forming region Rpx, etc. might occur.

If the pixel forming regions Rpx in the specific regions Rtmh and in the regions other than the specific regions Rtmh are set at a high temperature and at an equal temperature, the organic compound containing liquid is suppressed from aggregating in the specific regions Rtmh but the liquid supplied from the head of the ink jetting device or the nozzle printing device does not spread over the entire area surrounded by the bank 18, which in turn produces a thicker deposition in the center region where the liquid is adhered than in the peripheral regions including the specific regions Rtmh. Thus, according to the present embodiment, by setting the specific regions Rtmh at a higher temperature than the pixel forming regions Rpx other than the specific regions Rtmh, in other words, by setting the pixel forming regions Rpx other than the specific regions Rtmh at a lower temperature than the specific regions Rtmh, the organic compound containing liquid is prompted to dry before it aggregates too much in the specific regions Rtmh while the organic compound containing liquid is spread to some degree before it dries in the pixel forming regions Rpx other than the specific regions Rtmh, making it possible to form a film of the organic compound that has a relatively uniform thickness.

In the present embodiment, a case has been explained that the specific regions Rtmh of the substrate stage STG that are located at the end regions of the insulating substrate 11 at the upper and lower portions of FIG. 8 and that correspond to the bank 18 laid to extend in the left and right direction of FIG. 8 are set at a higher temperature than the regions other than these regions. However, the present invention is not limited to this case, but it is needless to say that the regions where the organic compound containing liquid easily aggregates, for example, all the regions along the bank 18, may be set at a higher temperature than the pixel forming regions Rpx between the bank 18.

In advance of forming the hole transporting layer 16a, the surface of the pixel electrode 15 (metal oxide layer) formed in the region in which the organic EL element OEL of each display pixel PIX is to be formed may be subjected to a lyophilicization treatment for making the surface affinitive to organic compound containing liquid of the hole transporting material. Further, the surface of the bank 18 may be subjected to a liquid repellency treatment for making the surface repel the organic compound containing liquid of the hole transporting material and the organic compound containing liquid of the electron-transporting light emitting material.

Figure 7H:
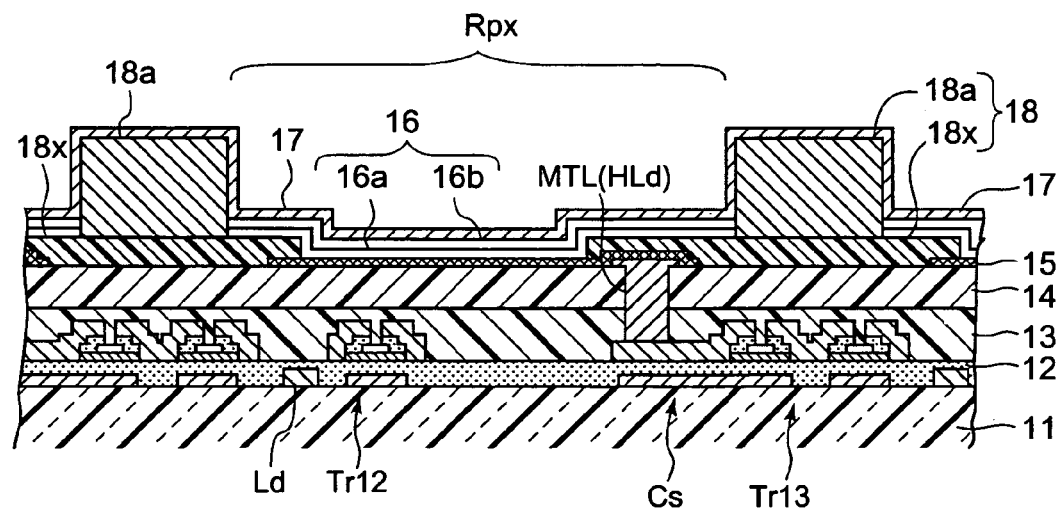

After this, as shown in FIG. 7H, a conductive layer (transparent electrode layer) made of, for example, ITO having optical transparency is formed on the insulating substrate 11 including at least the pixel forming regions Rpx of the display pixels PIX to form the opposing electrode (cathode electrode) 17, which faces the pixel electrodes 15 via the organic EL layers 16 (the hole transporting layers 16a and the electron-transporting light emitting layers 16b). Here, in case of the top emission type, the opposing electrode 17 can have a stacked structure transparent in the thickness-wise direction, which is obtained by forming a thin film made of a metallic material such as barium, magnesium, lithium fluoride, etc. by vapor deposition or the like to form the electron injection layer, and after this, stacking a transparent electrode layer made of ITO or the like on the electron injection layer by sputtering or the like. In case of the bottom emission type, the opposing electrode 17 can have a stacked structure having reflectivity, which is obtained by stacking a metallic layer made of aluminum or the like having a high work function on the electron injection layer.

At this time, the opposing electrode 17 is formed as a monolithic conductive layer that extends over not only the regions that face the pixel electrodes 15, but also the bank 18 that define the regions in which the organic EL elements OEL are formed, and also joined so as to be electrically connected to the bank metal portion 18a of the bank 18. This enables the bank metal portion 18a that constitute the bank 18 to be used as the common voltage lines (cathode lines) Lc connected in common to the display pixels PIX. Like this, by lining the bank metal portion 18a that are at the equal potential as the opposing electrode 17 in all the regions that are between the organic EL elements OEL, it is possible to reduce the sheet resistance of the cathode as a whole and to impart a display characteristic that is uniform all over the display panel 10.

Then, after the opposing electrode 17 is formed, the sealing layer 19 made of a silicon oxide film, a silicon nitride film, or the like is formed by CVD or the like on the entire area of the one surface side of the insulating substrate 11 as a protective insulating film (passivation film) and a sealing cover or the sealing substrate 20 is joined, thereby completing the display panel 10 having the cross sectional structure as shown in FIG. 5 and FIG. 6.

As described above, according to the present embodiment, by setting the temperature of the regions (the specific regions Rtmh of the substrate stage STG) that are near the bank 18 defining the pixel forming regions Rpx (the regions in which the organic EL elements OEL are formed) of the display pixels PIX to be higher than that of the other regions, it is possible to quickly heat and dry and fix the organic compound containing liquid (compound containing liquid) containing the organic material that is coated on the regions near the bank 18. Therefore, it is possible to form a display device (display panel 10) having organic EL layers 16 whose film thickness is generally uniform about the entire area of the pixel forming regions Rpx. Accordingly, since the light emission drive current that is supplied in the light emitting operation uniformly flows across about the entire area of the regions in which the organic EL elements OEL (organic EL layers 16) are formed, reduction in the aperture ratio of the display panel 10 is suppressed to improve the display quality, and deterioration of the organic EL layers 16 (organic EL elements OEL) due to concentration of the light emission drive current is suppressed to realize a display panel 10 that is excellent in reliability and longevity.

In the present embodiment described above, a case has been explained that copper (Cu), silver (Ag), or metal alloy thereof is used as the bank metal portion 18a. The present invention is not limited to this case, but any metallic material that has a low resistance, such as aluminum (Al), gold (Au), nickel (Ni), titanium (Ti), chromium (Cr), tungsten (W), etc. or metal alloy whose principal components are any of these may be used and a single-layered structure or a multilayered structure made of any of these materials may be used.

Figure 9:
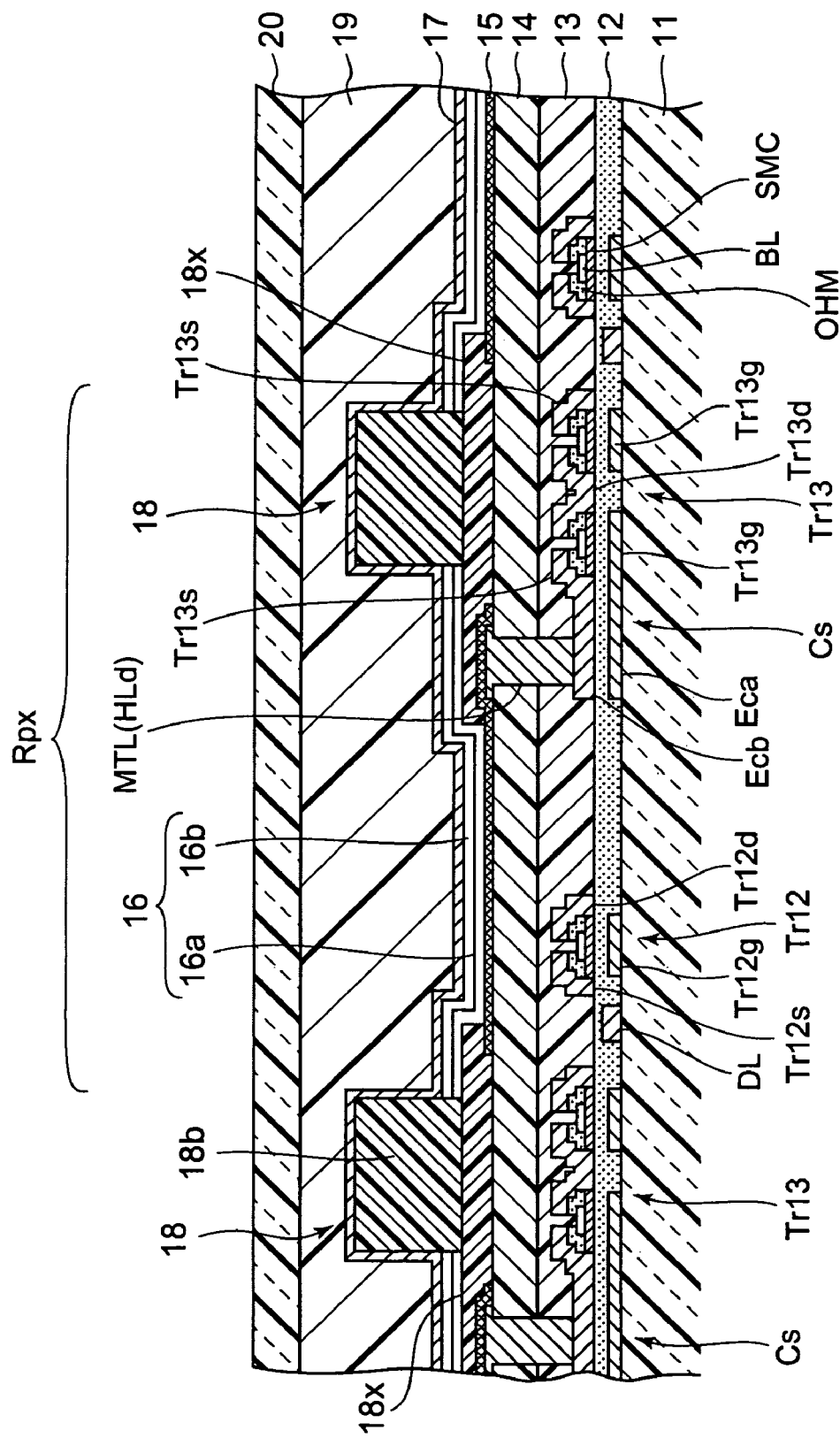
FIG. 9 is a schematic cross sectional diagram showing another example of the structure of the display pixel that is applicable to the display device (display panel) according to the present embodiment.
Figure 10:
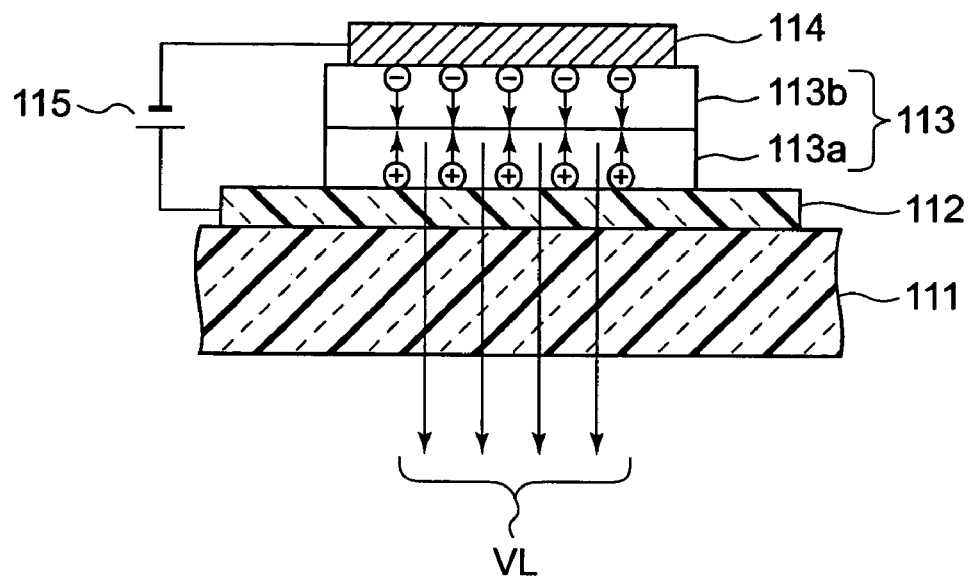
FIG. 10 is a schematic cross sectional diagram showing a basic structure of an organic EL element.

In the above-described embodiment, in a case where the amount of the current that flows in line with the display operation of the display panel 10 (the light emitting operation of the organic EL elements OEL) is small, instead of the structure shown in FIG. 5 that the bank metal portion 18a of the bank 18 is used as the common voltage lines Lc, such a structure as shown in FIG. 9 may be used that the base layer 18x and bank resin portion 18b are formed to surround the circumference (four aspects) of the regions in which the display pixels PIX (organic EL elements OEL) are formed only for the purpose of defining the pixel forming regions Rpx, and the common voltage line Lc is formed by the opposing electrode 17, which is formed so as to extend in common over the respective display pixels PIX. FIG. 9 is a schematic cross sectional diagram showing another example of the structure of the display pixel PIX that is applicable to the display device (display panel 10) according to the present embodiment.

According to the present embodiment, such a circuit structure of the light emission drive circuit DC provided in each display pixel PIX (color pixels PXr, PXg, and PXb) of the display panel 10 has been shown, in which n channel type thin film transistors Tr11 to Tr13 (i.e., thin film transistors having a single channel polarity) are used. Such a circuit structure can use only n channel type thin film transistors. Therefore, it is possible to easily manufacture these transistors, which have stable operation characteristics, by utilizing the already established techniques for manufacturing an amorphous silicon semiconductor, and to realize the light emission drive circuit DC which can suppress the unevenness of the display characteristics of the display pixels PIX.

Though the transistors Tr11 to Tr13 in the light emission drive circuit DC are all the n channel type here, any of these may be the p channel type. In this case, the source and drain of the p channel type transistor are related to each other reversely to the source and drain of the n channel type transistor. Further, the transistors Tr11 to Tr13 may not only be an amorphous silicon thin film transistor, but a polysilicon thin film transistor. Like this, the light emission drive circuit. DC may comprise transistors of only one channel polarity of either the n channel type or the p channel type, or may comprise transistors of both channel polarities of the n channel type and the p channel type.

According to the present embodiment, as the display pixel PIX (color pixels PXr, PXg, and PXb) of the display pixel 10, there has been shown the light emission drive circuit DC of a current assigning (current gradation control) type that has three transistors and sets the luminance gradation of the organic EL elements OEL by supplying a gradation current-Idata corresponding to display data. The display device according to the present invention is not limited to this, but other circuit structures of the current assigning type may be used as long as such structures set the current value of the light emission drive current in at least each display pixel based on display data and drive the organic EL element at the luminance gradation corresponding to that current value. Alternatively, a light emission drive circuit of a voltage assigning (voltage gradation control) type may be used, that sets the luminance gradation of the organic EL element by supplying a voltage component (gradation voltage) that corresponds to display data.

According to the present embodiment, the organic EL layer 16 as the carrier transporting layer comprises the hole transporting layer 16a and the electron-transporting light emitting layer 16b. The organic EL layer 16 according to the present invention is not limited to this case, but may comprise a hole-transporting light emitting layer and an electron transporting layer. Further, the organic EL layer 16 may comprise a single-layered structure of a hole-transporting/carrier-transporting light emitting layer, or a three-layered structure of a hole transporting layer, a light emitting layer, and a carrier transporting layer, or stacked structures of other types.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2005-365681 filed on Dec. 20, 2005 and including specification, claims, drawings and summary. The disclosure of the above Japanese Patent Application is incorporated herein by reference in its entirety.

What is claimed is:

1. A manufacturing method of a display device including a display panel comprising display elements which emit light, the method comprising:

heating at a first temperature, only a first predetermined region including a corner section of an internal wall of a partitioning wall, wherein the partitioning wall is formed on one surface of a substrate and defines a plurality of surrounded-regions each of which is surrounded by the partitioning wall and includes a plurality of pixel-regions on which pixels are to be formed, and heating only a second predetermined region, including a non-corner section of the internal wall of the partitioning wall, at a second temperature lower than the first temperature, wherein each of the first predetermined region and the second predetermined region includes at least a part of pixel-regions; and coating a containing liquid which contains a carrier transporting material on the pixel-regions;

wherein the partitioning wall defines the plurality of surrounded-regions so that the plurality of surrounded-regions are arrayed in a single line along a first direction, and each of the plurality of surrounded-regions includes the plurality of pixel-regions which are arrayed along a second direction that is perpendicular to the first direction;

wherein the first predetermined region consists of an area including a first end part of each of the surrounded-regions in the second direction and an area including a second end part of each of the surrounded-regions in the second direction, each end part contacting the partitioning wall at three sides thereof;

wherein the second predetermined region consists of an area including a remaining part of each of the surrounded-regions, the remaining parts contacting the partitioning wall at two opposing sides thereof; and wherein when coating the containing liquid in each of the surrounded regions, the containing liquid is continuously applied to the parts of the surrounded region corresponding to the first predetermined region and the remaining part of the surrounded region corresponding to the second predetermined region, while the first predetermined region has been heated at the first temperature and while the second predetermined region has been heated at the second temperature.

2. The manufacturing method of the display device according to claim 1, wherein the containing liquid is coated on the plurality of the pixel-regions with use of at least one of an ink jetting method and a nozzle printing method.

3. The manufacturing method of the display device according to claim 1, wherein the partitioning wall has at least one part made of one of a single metal and a metal alloy.

4. The manufacturing method of the display device according to claim 3, wherein the at least one part of the partitioning wall forms parts of wirings which are directly or indirectly connected to the pixels, each of the pixels including a display element and a driving circuit for driving the display element.

5. The manufacturing method of the display device according to claim 1, wherein each of the pixels includes a display element and a light emission drive circuit that comprises transistors and drives the display element so as to emit light.

6. The manufacturing method of the display device according to claim 1, wherein the first temperature is higher than the second temperature by 5 to 20° C.

7. The manufacturing method of the display device according to claim 1, wherein in each of the surrounded-regions, the plurality of pixels formed on the plurality of pixel-regions emit a light of a same color and are arranged on a straight line.

8. The manufacturing method of the display device according to claim 1, wherein the first predetermined region is maintained at the first temperature by a first heater, and the second predetermined region is maintained at the second temperature by a second heater.

9. The manufacturing method of the display device according to claim 1, wherein the first predetermined region comprises starting end regions and finishing end regions of lines along which the containing liquid that contains the carrier transporting material is coated.

10. The manufacturing method of the display device according to claim 1, wherein the carrier transporting material is made of a high-molecular organic material, and the display elements comprise organic electroluminescent elements.

11. A display device which is manufactured according to the manufacturing method of claim 1.

12. The manufacturing method of the display device according to claim 1, further comprising:
   a first temperature control heater which is positioned to correspond to the first predetermined region and which is adapted to be controlled to set a temperature of the first predetermined region to the first temperature; and
   a second temperature control heater which is positioned to correspond to the second predetermined region and which is adapted to be controlled to set a temperature of the second predetermined region to the second temperature;
   wherein the first temperature control heater and the second temperature control heater have longitudinal directions extending along the first direction.

13. The manufacturing method of the display device according to claim 12, wherein the first temperature control heater and the second temperature control heater comprise resistors which generate heat.

* * * * *